United States Patent
Wada

(10) Patent No.: US 12,000,883 B2
(45) Date of Patent: Jun. 4, 2024

(54) SEMICONDUCTOR DEVICE AND POWER CONVERSION DEVICE

(71) Applicant: Mitsubishi Electric Corporation, Tokyo (JP)

(72) Inventor: Yukihiko Wada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 407 days.

(21) Appl. No.: 17/606,048

(22) PCT Filed: Jun. 25, 2019

(86) PCT No.: PCT/JP2019/025170
§ 371 (c)(1),
(2) Date: Oct. 25, 2021

(87) PCT Pub. No.: WO2020/261385
PCT Pub. Date: Dec. 30, 2020

(65) Prior Publication Data
US 2022/0206057 A1    Jun. 30, 2022

(51) Int. Cl.
*G01R 31/26* (2020.01)
*G01R 31/28* (2006.01)
(Continued)

(52) U.S. Cl.
CPC ..... *G01R 31/2608* (2013.01); *G01R 31/2619* (2013.01); *G01R 31/2642* (2013.01);
(Continued)

(58) Field of Classification Search
None
See application file for complete search history.

(56) References Cited

U.S. PATENT DOCUMENTS 11,346,879 B2 * 5/2022 Kawahara ............... H01L 29/78
11,808,801 B2 * 11/2023 Kawahara .......... G01R 31/3008
(Continued)

FOREIGN PATENT DOCUMENTS

JP    2013-206997 A    10/2013
JP    2015-92140 A    5/2015
(Continued)

OTHER PUBLICATIONS

English translation of JP 2018031590 A (Year: 2018).*
(Continued)

*Primary Examiner* — Jermele M Hollington
(74) *Attorney, Agent, or Firm* — XSENSUS LLP

(57) ABSTRACT

A deteriorated section identifying unit refers to correspondence information that defines a deteriorated section of a plurality of bonding sections to the emitter electrode surface to which the first bonding wires are connected, for a combination of temporal change of a first voltage that is a difference between a potential at a collector main terminal and a potential at the emitter main terminal and temporal change of a second voltage that is a difference between a potential at the emitter reference terminal and a potential at the emitter main terminal, and identifies the deteriorated section corresponding to a combination of temporal change of the first voltage measured by a first voltage measuring circuit and temporal change of the second voltage measured by a second voltage measuring circuit.

15 Claims, 15 Drawing Sheets

(51) Int. Cl.
  *H01L 23/00*   (2006.01)
  *H01L 23/495*  (2006.01)
  *H01L 29/739*  (2006.01)
  *H02M 1/08*    (2006.01)
  *H02M 7/5387*  (2007.01)
  *H02P 27/08*   (2006.01)

(52) U.S. Cl.
  CPC .... *G01R 31/2853* (2013.01); *H01L 23/49562* (2013.01); *H01L 24/48* (2013.01); *H01L 29/7393* (2013.01); *H02M 1/08* (2013.01); *H02M 7/53871* (2013.01); *H01L 2224/48175* (2013.01); *H02P 27/08* (2013.01)

(56) References Cited

U.S. PATENT DOCUMENTS

2013/0257450 A1    10/2013  Omori et al.
2021/0116493 A1 *   4/2021  Kawahara .......... G01R 31/2642

FOREIGN PATENT DOCUMENTS

JP       2018031590 A  *  3/2018  ............... G02B 3/14
WO       2005/038919 A1    4/2005
WO    WO-2018211735 A1  * 11/2018  ......... G01R 31/2621

OTHER PUBLICATIONS

English translation of WO 2018/211735 A1 (Year: 2018).*
International Search Report and Written Opinion dated Aug. 27, 2019, received for PCT Application PCT/JP2019/025170, Filed on Jun. 25, 2019, 7 pages including English Translation.

* cited by examiner

| Lift-Off | ΔVce | ΔVee |
|---|---|---|
| 20A | 20%±ΔV2 | 10%±ΔV1 |
| 20B | 20%±ΔV2 | 40%±ΔV4 |
| 20C | 30%±ΔV3 | 10%±ΔV1 |
| 20D | 30%±ΔV3 | 40%±ΔV4 |

| DETERIORATED SECTION | | ΔVee | |
|---|---|---|---|
| | | 10%±ΔV1 | 40%±ΔV4 |
| ΔVce | 20%±ΔV2 | 20A | 20B |
| | 30%±ΔV3 | 20C | 20D |

| Lift-Off | ΔVce | ΔVee |
|---|---|---|
| 20B | 40%±ΔV4 | 80%±ΔV8 |
| 20C | 60%±ΔV6 | 20%±ΔV2 |
| 20D | 60%±ΔV6 | 80%±ΔV8 |

| DETERIORATED SECTION | | ΔVee | |
|---|---|---|---|
| | | 20%±ΔV2 | 80%±ΔV8 |
| ΔVce | 40%±ΔV4 | NONE MATCHED | 20B |
| | 60%±ΔV6 | 20C | 20D |

FIG.28

| Lift-Off | ΔVce | ΔVee |
|---|---|---|
| 20A | 20% OR MORE | 10% OR MORE |
| 20B | 20% OR MORE | 40% OR MORE |
| 20C | 30% OR MORE | 10% OR MORE |
| 20D | 30% OR MORE | 40% OR MORE |

FIG.29

| DETERIORATED SECTION | | ΔVee | |
|---|---|---|---|
| | | 10% OR MORE, LESS THAN 40% | 40% OR MORE |
| ΔVce | 20% OR MORE, LESS THAN 30% | 20A | 20A, 20B |
| | 30% OR MORE | 20A, 20C | 20A, 20B, 20C, 20D |

# SEMICONDUCTOR DEVICE AND POWER CONVERSION DEVICE

CROSS-REFERENCE TO RELATED APPLICATION

The present application is based on PCT filing PCT/JP2019/025170, filed Jun. 25, 2019, the entire contents of which are incorporated herein by reference.

TECHNICAL FIELD

The present invention relates to a semiconductor device and a power conversion device.

BACKGROUND ART

Power modules for use in power conversion devices and the like have a plurality of bonding wires connected to a power semiconductor element.

For example, PTL 1 describes a technique for detecting breakage of a plurality of bonding wires. The device in PTL 1 measures the electric characteristics of four first wires by feeding weak current to the four first wires and detects breakage of the four first wires by comparing the measured electric characteristics with a reference value.

CITATION LIST

Patent Literature

PTL 1: Japanese Patent. Laying-Open No. 2013-206997

SUMMARY OF INVENTION

Technical Problem

Unfortunately, PTL 1 fails to detect which of bonding sections of the bonding wires to a power semiconductor element has deteriorated.

An object of the present invention is therefore to provide a semiconductor device and a power conversion device capable of detecting which of bonding sections of a plurality of bonding wires to a power semiconductor element has deteriorated.

Solution to Problem

A semiconductor device of the present invention includes: a power semiconductor element; a collector substrate electrically connected to the power semiconductor element; a collector main terminal electrically connected to the collector substrate; an emitter main terminal connected to an emitter electrode surface of the power semiconductor element by a plurality of first bonding wires; an emitter reference terminal connected to the emitter electrode surface of the power semiconductor element by a second bonding wire; a first voltage measuring circuit to measure a first voltage that is a difference between a potential at the collector main terminal and a potential at the emitter main terminal; a second voltage measuring circuit to measure a second voltage that is a difference between a potential at the emitter reference terminal and a potential at the emitter main terminal; and a deteriorated section identifier to refer to correspondence information that defines a deteriorated section of a plurality of bonding sections to the emitter electrode surface to which the first bonding wires are connected, for a combination of temporal change of the first voltage and temporal change of the second voltage, and to identify the deteriorated section corresponding to a combination of temporal change of the first voltage measured by the first voltage measuring circuit and temporal change of the second voltage measured by the second voltage measuring circuit.

Advantageous Effects of Invention

According to the present invention, which of the bonding sections of a plurality of bonding wires to the power semiconductor element has deteriorated can be detected by referring to correspondence information that defines a deteriorated section of a plurality of bonding sections to the emitter electrode surface to which the first bonding wires are connected, for a combination of temporal change of the first voltage and temporal change of the second voltage.

BRIEF DESCRIPTION OF DRAWINGS

FIG. 28 is a diagram illustrating another example of the correspondence relation between the first deteriorated section and a combination of temporal change ΔVce of first voltage Vce and temporal change ΔVee of the second voltage Vee.

FIG. 29 is a diagram illustrating another example of the lookup table for identifying the first deteriorated section.

DESCRIPTION OF EMBODIMENTS

Embodiments of the present invention will be described below with reference to the drawings.

First Embodiment

Figure 1:
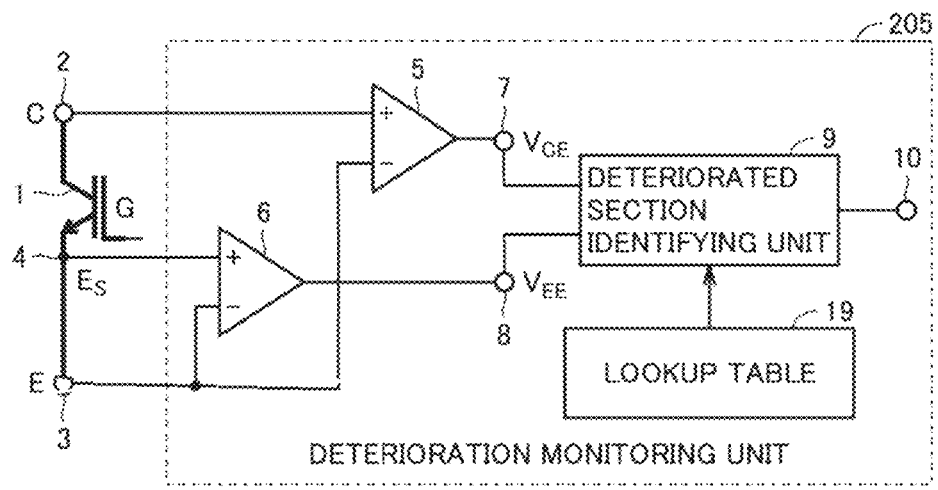
FIG. 1 is a diagram showing an overall configuration of a semiconductor device according to a first embodiment.

FIG. 1 is a diagram showing an overall configuration of a semiconductor device according to a first embodiment.

The semiconductor device includes a power semiconductor element 1, a collector main terminal 2, an emitter main terminal 3, an emitter reference terminal 4, and a deterioration monitoring unit 205.

Deterioration monitoring unit 205 includes a first voltage measuring circuit 5, a second voltage measuring circuit 6, a lookup table storage unit 19, a deteriorated section identifying unit 9, a first output terminal 7, a second output terminal 8, and a third output terminal 10.

Power semiconductor element 1 is configured with, for example, an insulated gate bipolar transistor (IGBT). Power semiconductor element 1 is connected to collector main terminal 2, emitter main terminal 3, and emitter reference terminal 4.

First voltage measuring circuit 5 is connected between collector main terminal 2 and emitter main terminal 3, First voltage measuring circuit 5 outputs information representing a first voltage Vce that is a difference between a potential at collector main terminal 2 and a potential at emitter main terminal 3 to first output terminal 7.

Second voltage measuring circuit 6 is connected between emitter reference terminal 4 and emitter main terminal 3. Second voltage measuring circuit 6 outputs information representing a second voltage Vee that is a difference between a potential at emitter reference terminal 4 and a potential at emitter main terminal 3 to second output terminal 8.

Lookup table storage unit 19 stores a lookup table. Deteriorated section identifying unit 9 refers to correspondence information in the lookup table to identify a deteriorated section corresponding to a combination of temporal change ΔVce of the first voltage measured by first voltage measuring circuit 5 and temporal change ΔVee of the second voltage measured by second voltage measuring circuit 6. Deteriorated section identifying unit 9 outputs information representing the identified deteriorated section to third output terminal 10.

How deteriorated section identifying unit 9 identifies a deteriorated section will be described below based on the operation of power semiconductor element 1.

Figure 2:
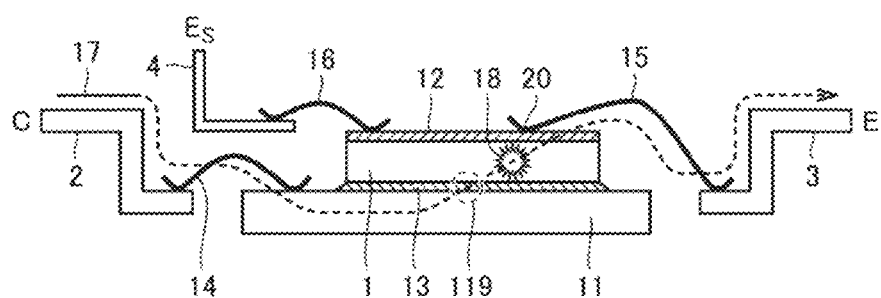
FIG. 2 is a diagram showing a cross section of a power module included in the semiconductor device.

FIG. 2 is a diagram showing a cross section of a power module included in the semiconductor device.

The power module includes power semiconductor element 1, a collector substrate 11, solder 13, collector main terminal 2, emitter main terminal 3, emitter reference terminal 4, an emitter-side main current bonding wire (hereinafter, first bonding wire) 15, an emitter reference bonding wire (hereinafter, second bonding wire) 16, and a collector-side main current bonding wire (hereinafter, third bonding wire) 14.

Power semiconductor element 1 is bonded on collector substrate 11 by solder 13. In power semiconductor element 1, a surface facing collector substrate 11 functions as a collector, and a surface on the side opposite to the surface functions as an emitter. The surface functioning as an emitter is an emitter electrode surface 12. A layer of metal with high conductivity, such as aluminum or copper, is formed on a surface of emitter electrode surface 12.

Collector main terminal 2, emitter main terminal 3, and emitter reference terminal 4 are connected to power semiconductor element 1 by a plurality of bonding wires 14, 15, and 16. More specifically, collector main terminal 2 is connected to collector substrate 11 by third bonding wire 14. Emitter main terminal 3 is connected to emitter electrode surface 12 by first bonding wire 15. Emitter reference terminal 4 is connected to emitter electrode surface 12 by second bonding wire 16.

Bonding portions are firmly bonded to the counterpart metal by a method that crushes the bonding portions of these bonding wires 14, 15, and 16 to the counterpart metal while applying ultrasound.

The lifetime of the power module is typically determined by the lifetime of the bonding portions of these bonding wires 14, 15, and 16. More specifically, the phenomenon that occurs first is that the bonding portions of bonding wires 14, 15, and 16 to the counterpart metal become deteriorated and the bonding portions become separated. The lifetime of power semiconductor element 1 itself, the lifetime depending on the material of bonding wires 14, 15, and 16, and the lifetime depending on the metal material forming collector main terminal 2, emitter main terminal 3, and emitter reference terminal 4 are far longer than the lifetime of the bonding portions of bonding wires 14, 15, and 16 to the counterpart metal.

The lifetime of solder 13 that bonds power semiconductor element 1 and collector substrate 11 is shorter than the lifetime depending on the materials described above but is longer than the lifetime of the bonding portions of bonding wires 14, 15, and 16 to the counterpart metal. The reason for this is as follows.

FIG. 2 shows a path 17 of main current flowing from collector main terminal 2 to emitter main terminal 3. The main current passes through collector main terminal 2, third bonding wire 14, collector substrate 11, solder 13, power semiconductor element 1, first bonding wire 15, and emitter main terminal 3 in order.

In path 17 of the main current, the part that generates heat is power semiconductor element 1. Unlike the other members, power semiconductor element 1 has a resistance value changing with gate control to turn on/off the main current. Since the resistance of power semiconductor element 1 is low, power semiconductor element 1 has the following characteristics. When power semiconductor element 1 cuts off current, a high voltage is applied to power semiconductor element 1 but current does not flow through power semiconductor element 1. When current flows through power semiconductor element 1, large current flows through power semiconductor element 1 but almost no voltage is applied to power semiconductor element 1. That is, power semiconductor element 1 consumes almost no power both at the time of current cut-off and at the time of energization. However, since both current and voltage are generated at the time of switching, the amount of heating of power semiconductor element 1 is large at the time of switching. This heating occurs only at the time of switching, and heating is less if the frequency of switching is low. However, power semiconductor element 1 is usually switching at a high frequency higher than a few kHz and repeats instantaneous heating at an extremely high frequency. FIG. 2 shows heating 18.

Power semiconductor element 1 repeatedly heats at a high frequency, thereby repeatedly applying thermal stress to the members connected to power semiconductor element 1. Consequently, the connected members become deteriorated. Collector substrate 11 is bonded to the collector side of power semiconductor element 1 through solder 13, and first bonding wire 15 is bonded to a surface of emitter electrode surface 12 that is the emitter side of power semiconductor element 1. Thermal stress is thus applied to solder 13 and first bonding wire 15.

FIG. 2 shows a section 119 where deterioration due to heating 18 of power semiconductor element 1 may occur in solder 13. A section 20 where deterioration due to heating 18 may occur is also shown at the bonding portion of first bonding wire 15 to emitter electrode surface 12.

Solder 13 is connected to the entire surface on the collector side of power semiconductor element 1. On the other hand, the area of the bonding section of first bonding wire 15 to emitter electrode surface 12 is equal to the cross-sectional area of first bonding wire 15 or at most several times larger than the cross-sectional area of first bonding wire 15. In other words, the density of current in the bonding section of first bonding wire 15 is greater than that in solder 13. Because of this, combined with the electromigration effect due to high density current, bonding section 20 of first bonding wire 15 comes to the end of its life first.

Therefore, to estimate the lifetime of the semiconductor device is to estimate the lifetime of bonding section 20 of first bonding wire 15 to emitter electrode surface 12. In the actual semiconductor device, a plurality of first bonding wires 15 are bonded to power semiconductor element 1. For example, more than 10 first bonding wires 15 are bonded to power semiconductor element 1 in some cases.

Figure 3:
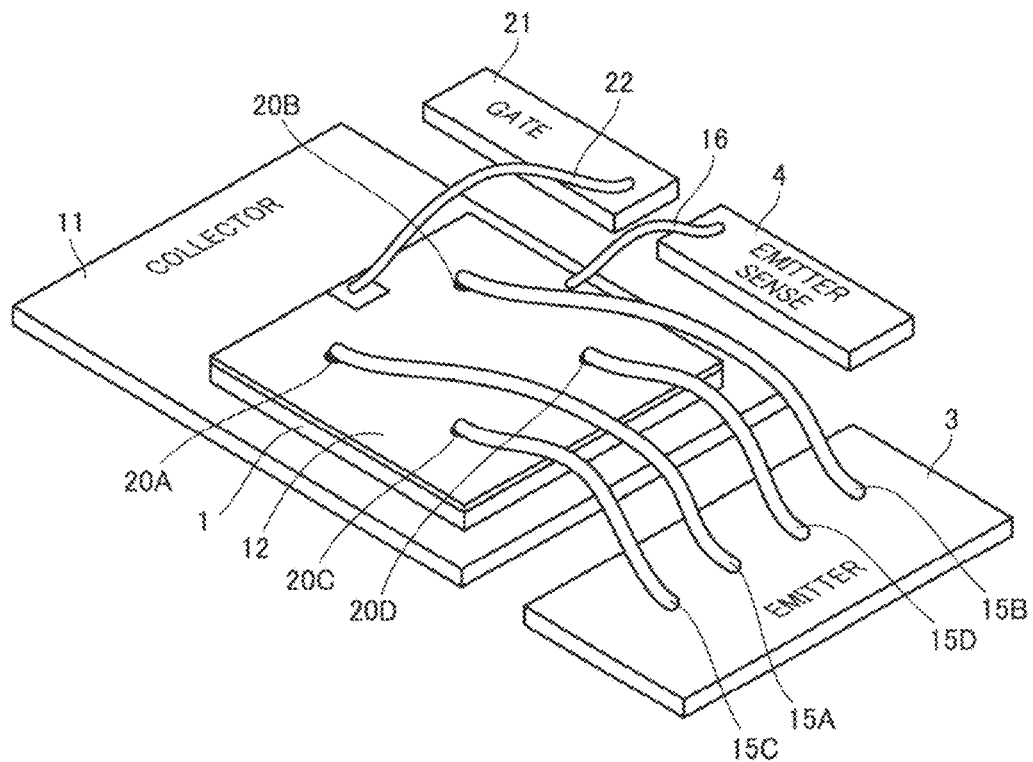
FIG. 3 is a perspective view showing a connection state between a power semiconductor element 1 and peripheral members.

FIG. 3 is a perspective view showing a state of connection between power semiconductor element 1 and peripheral members, Here, four first bonding wires 15A to 15D are bonded to power semiconductor element 1 at bonding sections 20A to 20D.

When some of a plurality of bonding sections 20A to 20D become deteriorated, the performance of the semiconductor device deteriorates but the semiconductor device may be able to continue operation. The criterion to determine that the semiconductor device comes to the end of its life when some of a plurality of bonding sections 20A to 20D deteriorate varies with the purpose of use of the semiconductor device. It may be determined promptly that the semiconductor device comes to the end of its life when some of bonding sections 20A to 20D deteriorate, or it may be determined that the semiconductor device comes to the end of its life when deterioration proceeds in a predetermined number or more of bonding sections 20A to 20D.

As shown in FIG. 3, when a plurality of bonding wires 15A to 15D are arranged, to estimate the lifetime of the semiconductor device is to determine how long the power module can be used until the ultimate deterioration state by determining the degree of a deterioration state of the power module at present with respect to the ultimate deterioration state considered as the end of life of the semiconductor device.

If the accuracy of determining the deterioration state of the power module is high, replacement work of the power module can be set at convenient timing. If the accuracy of determining the deterioration state of the power module is low, the semiconductor device may suddenly come to the end of its life at an unexpected time, causing a trouble to operation of the user of the power conversion device.

In order to determine the deterioration state of the power module accurately, the deterioration of bonding sections 20A to 20D of first bonding wires 15 need to be detected accurately. However, the traditional technique has its limit in accuracy of deterioration detection. This is because it fails to detect which bonding portion of bonding sections 20A to 20D of first bonding wires 15A to 15D have deteriorated. The conventional technique can detect deterioration of a plurality of bonding wires as a whole but cannot detect deterioration of each individual bonding wire.

When a plurality of first bonding wires 15 are arranged, the order of their deterioration is not always fixed. The order of deterioration of a plurality of first bonding wires 15 varies with the condition of use, that is, the driving method of power semiconductor element 1.

For example, m a first driving method, bonding section 20C or bonding section 20D may become deteriorated first, and after a short time, bonding section 20D or bonding section 20C may become deteriorated. In this case, half of the remaining first bonding wires 15 become deteriorated for a short time after the first deterioration. On the other hand, in a second driving method, bonding section 20A or bonding section 20B may become deteriorated first, and after a long time, bonding section 20B or bonding section 20A may become deteriorated. In such a case, the lifetime of the semiconductor device cannot be estimated accurately simply by detecting that one of four first bonding wires 15A to 15D has deteriorated. Even in a case where it is determined that the life of the semiconductor device comes to an end when half of the first bonding wires deteriorate, there is a difference in length of time until the end of life between when bonding section 20C deteriorates first and when bonding section 20A deteriorates first.

The conventional technique requires a process such as checking the resistance value by feeding current individually to each bonding wire in some way. That is, deterioration of each individual bonding wire cannot be detected without using an expensive apparatus and a complicated testing method.

The present embodiment can identify which of the bonding sections of a plurality of first bonding wires 15 to emitter electrode surface 12 of power semiconductor element 1 has deteriorated, without requiring a special apparatus. The principle will now be described in detail.

First voltage Vce is the difference between a potential at collector main terminal 2 and a potential at emitter main terminal 3. First voltage Vce is the voltage between collector main terminal 2 and emitter main terminal 3 which are originally installed in the power module. Thus, first voltage Vce can be measured without adding a special configuration to the power module. First voltage Vce is measured while power semiconductor element 1 is energized. Power semiconductor element 1 is connected in series to bonding section 20 of first bonding wire 15 between collector main terminal 2 and emitter main terminal 3. Thus, the magnitude of first voltage Vce is equal to or greater than the sum of the magnitude of voltage produced by the resistance of power semiconductor element 1 and the magnitude of voltage by bonding section 20 of first bonding wire 15.

Second voltage Vee is the difference between a potential at emitter reference terminal 4 and a potential at emitter main terminal 3. Second voltage Vee is the voltage between the emitter main terminal and emitter reference terminal 4 which are originally installed in the power module. Gate terminal 21 is connected to the gate of power semiconductor element 1 by a gate bonding wire 22. Emitter reference terminal 4 is used to provide a reference potential serving as a reference of voltage applied to gate terminal 21. This reference potential is required to be equal to the potential at emitter electrode surface 12. Thus, emitter reference terminal 4 is connected to emitter electrode surface 12 by a second bonding wire 16. Emitter main terminal 3 is unable to be used for providing this reference potential. This is because main current by energization of power semiconductor element 1 causes a voltage drop due to the resistance of the path from emitter electrode surface 12 to emitter main terminal 3, and the potential at emitter main terminal 3 does not correctly reflect the potential at emitter electrode surface 12. Since the main current does not flow through emitter reference terminal 4 and second bonding wire 16, there is almost no difference between the potential at emitter reference terminal 4 and the potential at emitter electrode surface 12. Emitter reference terminal 4 therefore can provide a correct reference potential.

Furthermore, electromigration does not occur because current with high current density does not flow through second bonding wire 16. Second bonding wire 16 is typically connected to the vicinity of the edge where the temperature of power semiconductor element 1 tends to be low. Thus, deterioration of second bonding wire 16 is less likely to proceed. As for second bonding wires 16, a plurality of second bonding wires 16 may be provided to ensure redundancy.

Since the path of second voltage Vee does not include power semiconductor element 1 itself, the resistance value of power semiconductor element 1 does not affect the magnitude of second voltage Vee. Second voltage Vee is regarded as the potential difference between emitter electrode surface 12 and emitter main terminal 3 but, strictly speaking, it is not the same. This will be described later.

The principle of generation of first voltage Vce will now be described.

As described above, the magnitude of first voltage Vce is equal to or greater than the sum of the magnitude of voltage produced by the resistance of power semiconductor element 1 and the magnitude of voltage by bonding section 20 of first bonding wire 15. However, first voltage Vee is affected not only by the resistance of first bonding wire 15 but also by the resistance due to current flowing through the inside of emitter electrode surface 12.

Figure 4:
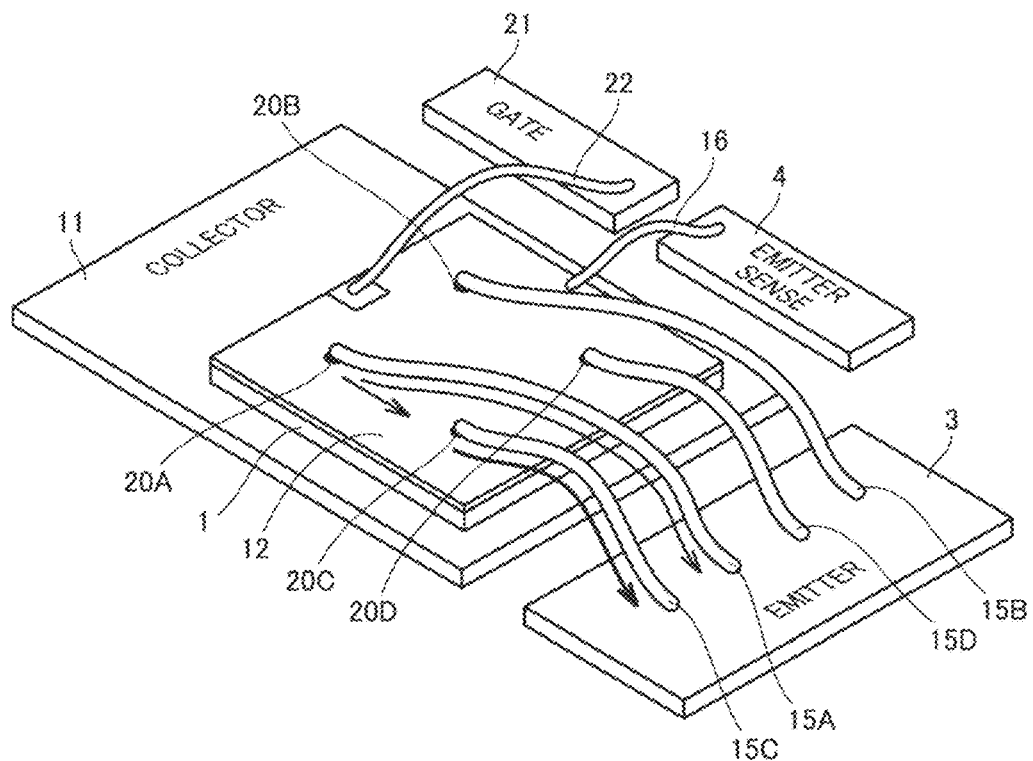
FIG. 4 is a diagram illustrating the direction in which main current flows and part of the magnitude of main current.

FIG. 4 is a diagram illustrating the direction in which main current flows and part of the magnitude of main current. Since the main current flows from the collector to the emitter, the main current flows from collector substrate 11 into power semiconductor element 1, then flows to emitter electrode surface 12 of power semiconductor element 1, and further flows to emitter main terminal 3 through first bonding wires 15A to 15D. Here, the current flowing through first bonding wires 15A to 15O is not uniform. For example, part of current flowing to immediately below bonding section 20A follows a path to emitter main terminal 3 through first bonding wire 15A. The remaining part of current flowing to immediately below bonding section 20A flows to bonding section 20C through emitter electrode surface 12 and then follows a path to emitter main terminal 3 through first bonding wire 15C. On the other hand, the current flowing to immediately below bonding section 20C mainly follows a path to emitter main terminal 3 through first bonding wire 15C. This is because the other paths are a long way and the resistance values of the other paths are large.

As a result, for example, even when bonding section 20A deteriorates and energization of first bonding wire 15A stops, the influence is relatively small. Even when not being able to pass through first bonding wire 15A, current flowing to bonding section 20A can flow from bonding section 20C to emitter main terminal 3 through first bonding wire 15C with a relatively small cost. In comparison, when bonding section 20C deteriorates and energization of first bonding wire 15C stops, the influence is relatively large. This is because current flowing from bonding section 20C directly to emitter main terminal 3 through first bonding wire 15C must flow from another bonding section to emitter main terminal 3 through a path with a larger resistance.

In other words, the increase of first voltage Vce that is caused when bonding section 20A of first bonding wire 15A deteriorates is relatively small. On the other hand, the increase of first voltage Vee that is caused when bonding section 20C of first bonding wire 15C deteriorates is relatively large. For example, when bonding section 20A deteriorates first, first voltage Vce increases 20%, whereas when bonding section 20C deteriorates first, first voltage Vce increases 30%.

However, the deteriorated bonding section of first bonding wires 15A to 15D is unable to be identified only with temporal change of first voltage Vce. This is because when a large number of first bonding wires 15A to 15D are arranged, there may be other first bonding wires under the same condition. For example, when bonding section 208 deteriorates first, first voltage Vce may increase 20%, and when bonding section 200 deteriorates first, first voltage Vce may also increase 30%. Therefore, the deteriorated bonding section is unable to be identified only with first voltage Vce.

Second voltage Vee will now be described.

Second voltage Vee is often supposed to reflect the resistance values of first bonding wires 15A to 15D because it is the difference between the potential at emitter reference terminal 4 and the potential at emitter main terminal 3, hut there is more. The surface of emitter electrode surface 12 of power semiconductor element 1 has a resistance component although it has a metal layer. As described above, since current flows through the inside of emitter electrode surface 12, second voltage Vee also reflects the potential difference due to the resistance component. From a different point of view, the reason why the potential at emitter reference terminal 4 and the potential at emitter main terminal 3 are substantially equal is that emitter reference terminal 4 and emitter main terminal 3 are coupled by first bonding wire 15. In other words, without first bonding wire 15, the voltage between emitter reference terminal 4 and emitter main terminal 3 may increase. Therefore, the influence that deterioration of first bonding wire 15 has on second voltage Vee heavily depends on how close the banding section of second bonding wire 16 is to the deteriorated section of bonding sections 20A to 250 of the first bonding wires.

Figures 5, 6, 7:
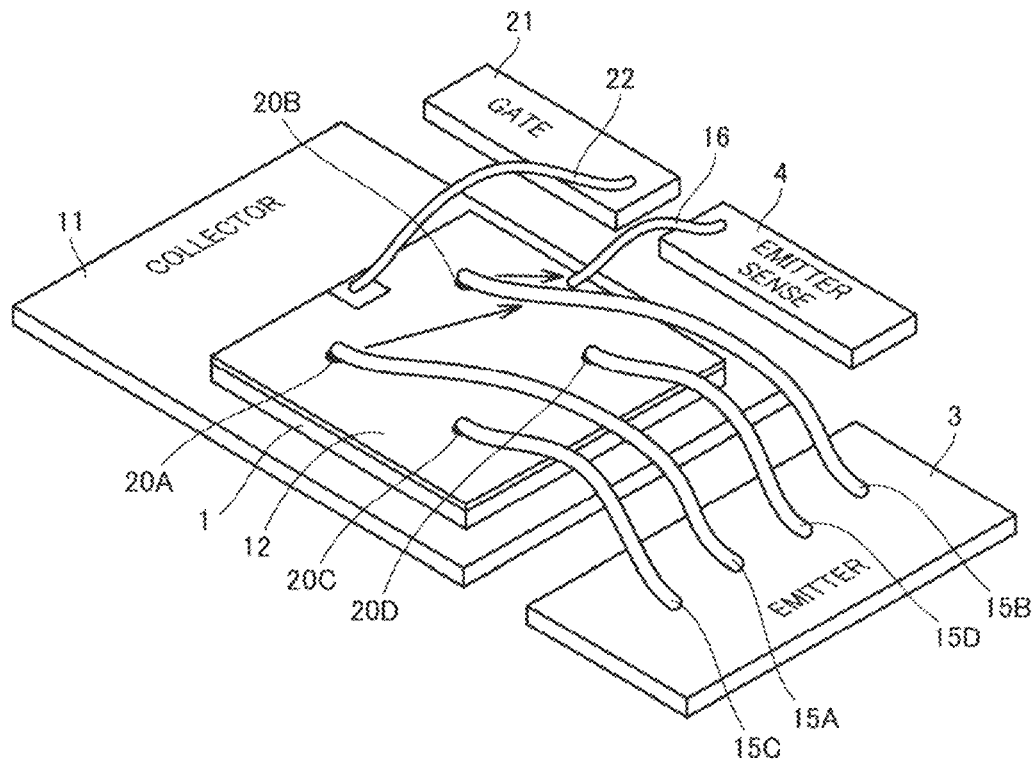
FIG. 5 is a diagram for explaining the distance between a deteriorated bonding section and a connection portion of a second bonding wire 16.
FIG. 6 is a diagram illustrating an example of the correspondence relation between a first deteriorated section and a combination of temporal change $\Delta Vce$ of a first voltage $Vce$ and temporal change $\Delta Vee$ of a second voltage $Vee$.
FIG. 7 is a diagram illustrating an example of a lookup table for identifying the first deteriorated section.

FIG. 5 is a diagram for explaining the distance between a deteriorated bonding section and a connection portion of second bonding wire 16. In FIG. 5, the difference in distance between the deteriorated bonding section and the connection portion of second bonding wire 16 is indicated by arrows.

Bonding section 20B of first bonding wire 15B is close to the connection portion of second bonding wire 16 to emitter electrode surface 12. Bonding section 20A of first bonding wire 13A is far from the connection portion of second bonding wire 16 to emitter electrode surface 12. When bonding section 20B deteriorates first, second voltage Vee significantly rises, whereas when bonding section 20A deteriorates first, second voltage Vee does not significantly rise. In other words, the rise value of second voltage Vee varies depending on the deteriorated bonding section of first bonding wire 15. For example, when bonding section 20B deteriorates first, second voltage Vee rises 40%, whereas when bonding section 20A deteriorates first, second voltage Vee rises only 10%.

However, when there are a large number of first bonding wires 15, there may be other first bonding wires 15 under the same condition. For example, in the case of FIG. 4, when bonding section 20D deteriorates first, second voltage Vee increases 40%, and when bonding section 20C deteriorates first, second voltage Vee increases 10% as well. The deteriorated bonding section is unable to be identified only with second voltage Vee.

The present embodiment differs from the conventional technique in that deterioration monitoring unit 205 in the present embodiment considers the characteristics of power semiconductor element 1 as described above, then measures first voltage Vee and second voltage Vee and identifies a deteriorated section in accordance with their temporal changes.

FIG. 6 is a diagram illustrating an example of the correspondence relation between the first deteriorated section and a combination of temporal change ΔVce of first voltage Vce and temporal change Vce of the second voltage Vee.

When the first deteriorated section is bonding section 20A, first voltage Vce increases by 20%±ΔV2 and second voltage Vee increases by 10%±ΔV1. When the first deteriorated section is bonding section 20B, first voltage Vce increases by 20%±ΔV2 and second voltage Vee increases by 40%±ΔV4. When the first deteriorated section is bonding section 20C, first voltage Vce increases by 30%±ΔV3 and second voltage Vee increases by 10%±ΔV1. When the first deteriorated section is bonding section 20D, first voltage Vce increases by 30%±ΔV3 and second voltage Vee increases by 40%±ΔV4. For example, ΔV1 is 1%. ΔV2 is 2%, ΔV3 is 3%, and ΔV4 is 4%.

FIG. 7 is a diagram illustrating an example of a lookup table for identifying the first deteriorated section. This lookup table can be derived from the correspondence relation in FIG. 6.

The lookup table includes correspondence information that defines a deteriorated section of a plurality of bonding sections to emitter electrode surface 12 to which a plurality of first bonding wires 15 are connected, for a combination of temporal change ΔVce of the first voltage and temporal change ΔVee of the second voltage.

As shown in FIG. 7, it is defined that the first deteriorated section is bonding section 20A when first voltage Vee increases by 20%±ΔV2 and second voltage Vee increases by 10%±ΔV1. It is defined that the first deteriorated section is bonding section 20B when first voltage Vce increases by 20%±ΔV2 and second voltage Vee increases by 40%±ΔV4. It is defined that the first deteriorated section is bonding section 20C when first voltage Vce increases by 30%±ΔV3 and second voltage Vee increases by 10%±ΔV1. It is defined that the first deteriorated section is bonding section 20D when first voltage Vce increases by 30%±ΔV3 and second voltage Vee increases by 40%±ΔV4.

As indicated by the following equation (1), deteriorated section identifying unit 9 calculates temporal change ΔVce between first voltage Vce(n) at the present point of time n and first voltage Vce(n−1) at the previous point of time (n−1). As indicated by the following equation (2), deteriorated section identifying unit 9 calculates temporal change ΔVee between second voltage Vee(n) at the present point of time n and second voltage Vee(n−1) at the previous point of time (n−1).

$$\Delta Vce = Vce(n) - Vce(n-1) \tag{1}$$

$$\Delta Vee = Vee(n) - Vee(n-1) \tag{2}$$

Alternatively, as indicated by the following equation (1A), deteriorated section identifying unit 9 may calculate temporal change ΔVce between first voltage Vce(n) at the present point of time n and first voltage Vce(n−1) at the previous point of time (n−1). As indicated by the following equation (2A), deteriorated section identifying unit 9 may calculate temporal change ΔVee between second voltage Vee(n) at the present point of time n and second voltage Vee(n−1) at the previous point of time (n−1).

$$\Delta Vce = \{Vce(n) - Vce(n-1)\}/Vce(n-1) \tag{1A}$$

$$\Delta Vee = \{Vce(n) - Vee(n-1)\}/Vee(n-1) \tag{2A}$$

Deteriorated section identifying unit 9 refers to the lookup table and identifies the deteriorated section corresponding to the combination of temporal change ΔVce of first voltage Nice and temporal change ΔVce of second voltage Vee. When the combination of temporal change ΔVce of first voltage Vice and temporal change ΔVce of second voltage Vee is not included in the lookup table, deteriorated section identifying unit 9 determines that a plurality of bonding sections to emitter electrode surface 12 to which a plurality of first bonding wires 15 are connected do not have a deteriorated section.

As described above, the semiconductor device according to the first embodiment can detect which of the bonding sections of a plurality of first bonding wires 15 to power semiconductor element 1 has deteriorated, by measuring the voltage between two existing terminals and referring to the lookup table stored in advance, without adding a special structure. As a result, the lifetime of the semiconductor device can be estimated accurately.

Second Embodiment

When there are a large number of first bonding, wires, the order in which the bonding portions of the first bonding wires become deteriorated may vary depending on the use condition and the load condition of the power module, that is, the driving method. The next deteriorated section can be accurately estimated in some cases by using the history of deteriorated bonding sections. A second embodiment uses a lookup table corresponding to the history of deteriorated bonding sections.

Figures 8, 9, 10:
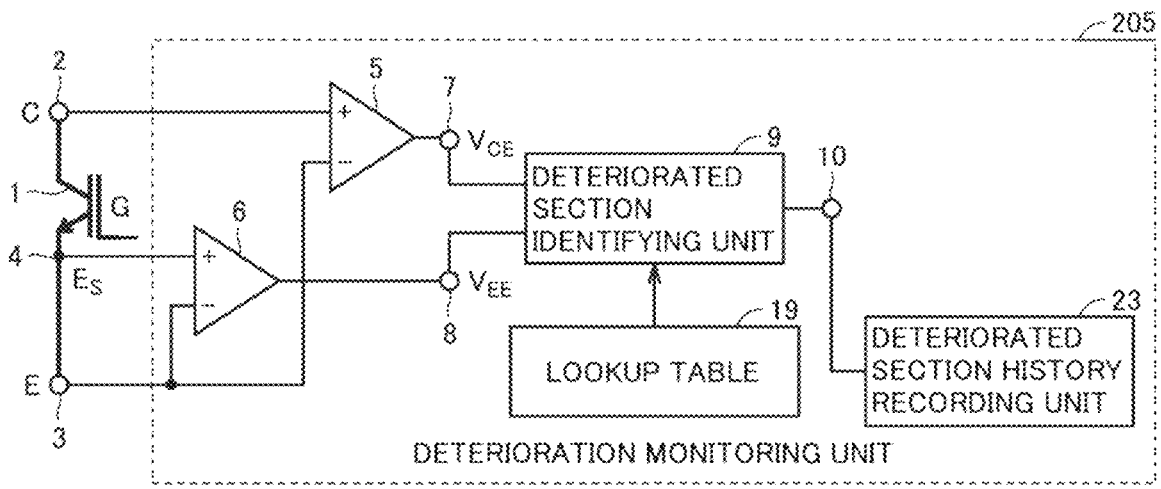
FIG. 8 is a diagram showing a configuration of a semiconductor device according to a second embodiment.
FIG. 9 is a diagram illustrating the correspondence relation between a second deteriorated section and a combination of temporal change of first voltage $Vce$ and temporal change of second voltage $Vee$ in a case where the first deteriorated section is a bonding section 20A.
FIG. 10 is a diagram illustrating a lookup table for identifying the second deteriorated section in a case where the first deteriorated section is bonding section 20A.

FIG. 8 is a diagram showing a configuration of a semiconductor device according to the second embodiment. A semiconductor device according to the second embodiment includes a deteriorated section history recording unit 23 in addition to the components of the semiconductor device according to the first embodiment, Deteriorated section history recording unit 23 records history of deteriorated bonding sections of the first bonding wires.

When none of a plurality of bonding sections deteriorates, deteriorated section identifying unit 9 refers to a lookup table for no deterioration shown in FIG. 7 and identifies the deteriorated section. When any of a plurality of bonding sections deteriorates, deteriorated section identifying unit 9 refers to a lookup table corresponding to a deteriorated section and identifies the deteriorated section.

FIG. 9 is a diagram illustrating the correspondence relation between a second deteriorated section and a combination of temporal change ΔVee of first voltage Vce and temporal change of second voltage Vee in a case where the first deteriorated section is bonding section 20A.

When the second deteriorated section is bonding section 20B, first voltage Vce increases by 40%±ΔV4 and second voltage Vee increases by 80%±ΔV8. When the second deteriorated section is bonding section 20C, first voltage Vce increases by 60%±ΔV6 and second voltage Vee increases by 20%±ΔV2. When the second deteriorated section is bonding section 20B, first voltage Vee increases by 60%±ΔV6 and second voltage Vee increases by 80%±ΔV8. For example, ΔV2 is 2%, ΔV4 is 4%, ΔV6 is 6%, and ΔV8 is 8%.

FIG. 10 is a diagram illustrating a lookup table for identifying, the second deteriorated section in a case where the first deteriorated section is bonding section 20A. This lookup table can be derived from the correspondence relation in FIG. 9.

It is defined that the second deteriorated section is bonding section 20B when first voltage Vee increases by 40%±ΔV4 and second voltage Vee increases by 80%±ΔV8. It is defined that the second deteriorated section is bonding section 20C when first voltage Vice increases by 60%±ΔV6 and second voltage Vee increases by 20%±ΔV2. It is defined that the second deteriorated section is bonding section 20D when first voltage Vce increases by 60%±ΔV6 and second voltage Vee increases by 80%±ΔV8.

When the first deteriorated section is bonding section 20A, deteriorated section identifying unit 9 refers to the lookup table shown in FIG. 10 and identifies the second deteriorated section corresponding to the measured ΔVce and ΔVee. Similarly, when the first deteriorated sections are bonding sections 20B, 20C, and 20D, deteriorated section identifying unit 9 refers to the lookup tables corresponding to 20B, 20C, and 20D and identifies the second deteriorated section corresponding to the measured ΔVce and ΔVee.

Deteriorated section identifying unit 9 may identify the i-th deteriorated section by referring to the lookup table for identifying the i-th deteriorated section corresponding to the first to the (i−1)th deteriorated sections.

As described above, the present embodiment can identify the next deteriorated section in accordance with the history of deteriorated sections.

Third Embodiment

The semiconductor device according to a third embodiment estimates the lifetime of the semiconductor device and proposes to change the driving method, based on the history of deteriorated bonding sections and the driving method in use.

Figure 11:
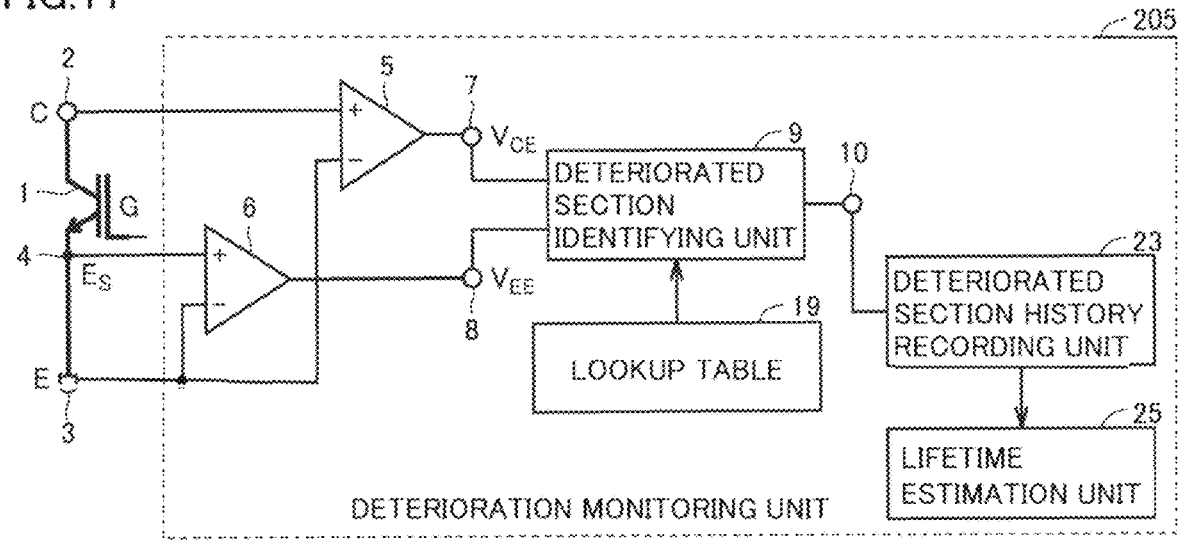
FIG. 11 is a diagram illustrating a configuration of a semiconductor device according to a third embodiment.

FIG. 11 is a diagram showing a configuration of a semiconductor device according to the third embodiment. The semiconductor device according to the third embodiment includes a lifetime estimation unit 25 in addition to the components of the semiconductor device according to the second embodiment.

The history of deteriorated sections output from deteriorated section history recording unit 23 is sent to lifetime estimation unit 25. Lifetime estimation unit 25 estimates the lifetime of the semiconductor device with use of the driving method at present, based on the history of deteriorated bonding sections and the driving method of power semiconductor element 1.

The driving method is represented by a combination of conditions of switching power semiconductor element 1. Specifically, the driving method includes collector voltage, collector current, gate voltage, gate current, and switching frequency applied to power semiconductor element 1.

As described below, the lifetime of the semiconductor device may vary with the driving method.

In a driving method A, the power efficiency is high but electromagnetic noise is also large. When the driving method A is used, one of bonding section 20C or 20D deteriorates first. Then, when deterioration occurs in one of bonding section 20C or 20D, after a short time, deterioration occurs in the other of bonding section 20C or 20D, and the semiconductor device comes to the end of its life. In a driving method B, the power efficiency is slightly low but electromagnetic noise is little. When the driving method B is used, one of bonding section 20A or 20B deteriorates first. Then, when deterioration occurs in one of bonding section 20A or 20B, after a long time, deterioration occurs in the other of bonding section 20A or 20B, and the semiconductor device comes to the end of life.

For example, when the "driving method A" is continuously used from the beginning and deterioration of bonding section 20C of first bonding wire 15C is detected after 10,000 hours, lifetime estimation unit 25 estimates, for example, that with the use of the driving method A, half of the bonding sections of first bonding wires 15 deteriorate after another 100 hours and then the semiconductor device comes to the end of its life. Alternatively, when the "driving method B" is continuously used from the beginning and deterioration of bonding section 20A of first bonding wire 15D is detected after 10,000 hours, lifetime estimation unit 25 estimates, for example, that with the use of the driving method B, half of the bonding sections of first bonding wires 15 deteriorate after another 1,000 hours and then the semiconductor device comes to the end of its life.

In this way, the history of deteriorated sections of a plurality of bonding sections is sometimes related to the subsequent deterioration speed, and this can be used to improve the accuracy in prediction of the lifetime of the semiconductor device.

Lifetime estimation unit 25 gives a notice to the user to recommend switching to a driving method that prolongs the lifetime. For example, when the driving method A is used and deterioration of bonding section 20C or 20D is detected first, lifetime estimation unit 25 recommends switching to the driving method B with which the time taken to reach the end of life is longer.

Lifetime estimation unit 25 may further execute automatic switching to a driving method that prolongs the lifetime, together with a not-shown control circuit. For example, when the driving method A is used and deterioration of bonding section 20C or 20D is detected first, lifetime estimation unit 25 instructs the control circuit to switch to the driving method B, and the control circuit controls switching to the driving method B.

As described above, the semiconductor device according to the third embodiment can estimate the lifetime of the semiconductor device and propose a driving method that prolongs the lifetime, based on the history of deteriorated bonding sections and the driving method of the power semiconductor device.

Fourth Embodiment

Figure 12:
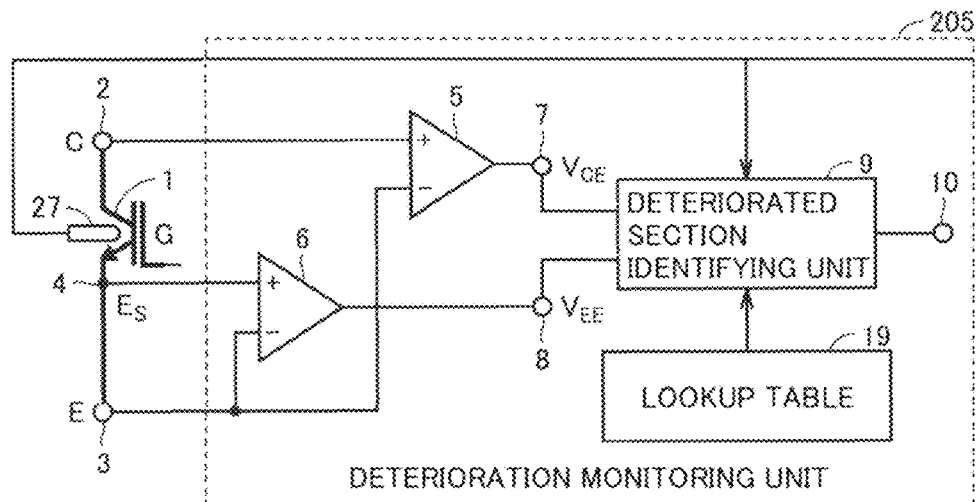
FIG. 12 is a diagram illustrating a configuration of a semiconductor device according to a fourth embodiment.

FIG. 12 is a diagram illustrating a configuration of a semiconductor device according to a fourth embodiment. The semiconductor device according to the fourth embodiment includes a temperature sensor 27 in addition to the components of the semiconductor device according to the first embodiment.

Temperature sensor 27 measures temperature Tk of power semiconductor element 1. Temperature sensor 27 may be a separate element using a thermistor or a thermocouple or may be a temperature sensing diode incorporated in power semiconductor element 1.

Figure 13:
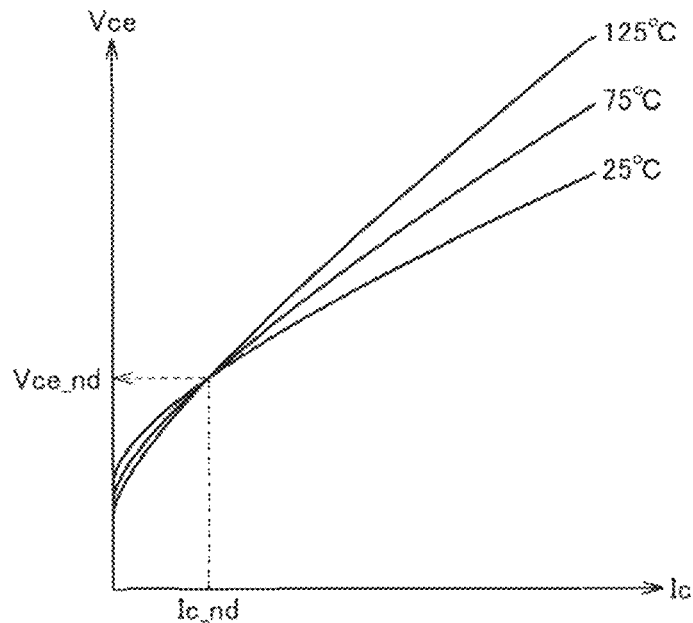
FIG. 13 is a diagram illustrating the relation between collector current $Ic$ and first voltage $VCe$ in an IGBT.

FIG. 13 is a diagram illustrating the relation between collector current Ic and first voltage Vce in the IGBT.

First voltage Vce changes with collector current Ic and temperature Tk of power semiconductor element 1.

Even when power semiconductor element 1 is energized with the same collector current Ic, the resistance value of power semiconductor element 1 changes with temperature Tk of power semiconductor element 1. As a result, for example, first voltage VCe produced at 25° C. differs from the value of first voltage Vce produced at 125° C.

Therefore, even when the degree of deterioration of first bonding wire 15 does not change at all, the value of first voltage Vce changes with temperature Tk of power semiconductor element 1. If this is not taken into consideration, it may be erroneously determined that first bonding wire 15 deteriorates, although it does not deteriorate. As shown in FIG. 13, an IGBT usually has collector current Ic_nd at which first voltage Vce does not change even when temperature Tk of power semiconductor element 1 changes in a certain temperature range. When temperature Tk of power semiconductor element 1 is temperatures 25° C. to 125° C., first voltage Vce measured with collector current Ic_nd is a fixed value Vce_nd and therefore change in temperature Tk of power semiconductor element 1 can be avoided. However, when temperature Tk of power semiconductor element 1 is beyond the temperature range (25° C. to 125° C.), first voltage Vce measured with collector current Ic_nd is sometimes not Vce_nd.

The lookup table in FIG. 10 described in the first embodiment defines the deteriorated section of the bonding sections of the first bonding wires to power semiconductor element 1, for change ΔVce of the first voltage and change ΔVee of the second voltage with temperature Tk of power semiconductor element 1 being standard temperature (25° C.). Therefore, when temperature Tk of power semiconductor element 1 differs from the standard temperature, change ΔVce of the first voltage and change ΔVee of the second voltage need to be corrected in order to use the lookup table.

In the present embodiment, deteriorated section identifying unit 9 corrects temporal change ΔVce of first voltage Vee in accordance with temperature Tk of power semiconductor element 1.

Figure 14:
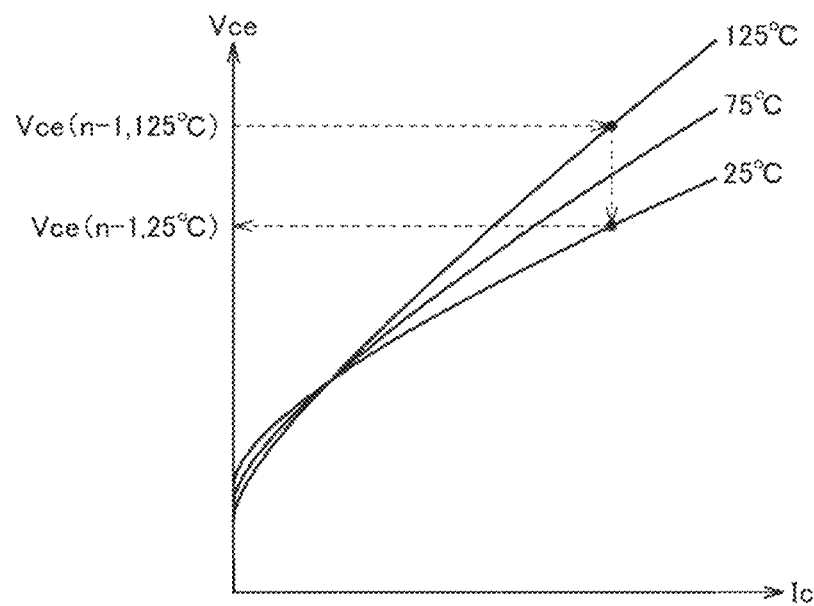
FIG. 14 is a diagram for explaining correction of first voltage $Vce$ at the point of time (n−1) a point of time earlier than the present point of time n.

FIG. 14 is a diagram for explaining correction of first voltage Vce at the point of time (n−1) a point of time earlier than the present point of time n.

When temperature Tk of power semiconductor element 1 is 125° C. and first voltage Vce is Vce (n−1, 125° C.) at the point of time (n−1), as shown in FIG. 14, deteriorated section identifying unit 9 determines first voltage Vce (n−1, 25° C.) when temperature Tk of power semiconductor element 1 is 25° C. under the condition that collector current Ic is the same.

Figure 15:
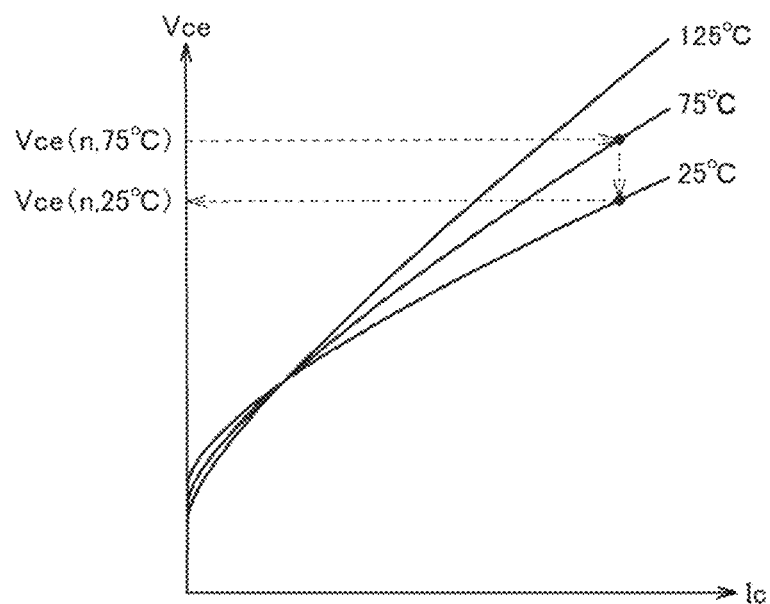
FIG. 15 is a diagram for explaining correction of first voltage $Vce$ at the present point of time n.

FIG. 15 is a diagram for explaining correction of first voltage VCe at the present point of time n.

When temperature Tk of power semiconductor element 1 is 75° C. and first voltage Vce is Vce (n, 75° C.) at the point of time n, as shown in FIG. 15, deteriorated section identifying unit 9 determines first voltage Vce (n, 25° C.) when temperature Tk of power semiconductor element 1 is 25° C. under the condition that collector current Ic is the same.

Temporal change ΔVce of the first voltage with no correction with temperature Tk of power semiconductor element 1 is given as follows.

$$\Delta Vce = Vee(n, 75° C.) - Vee(n-1, 125° C.) \qquad (3)$$

In comparison, deteriorated section identifying unit 9 according to the present embodiment determines temporal change ΔVce (25° C.) of the first voltage, using Vce (n, 25° C.) and Vce (n−1, 25° C.).

$$\Delta Vce(25° C.) = Vce(n, 25° C.) - Vce(n-1, 25° C.) \qquad (4)$$

Figure 16:
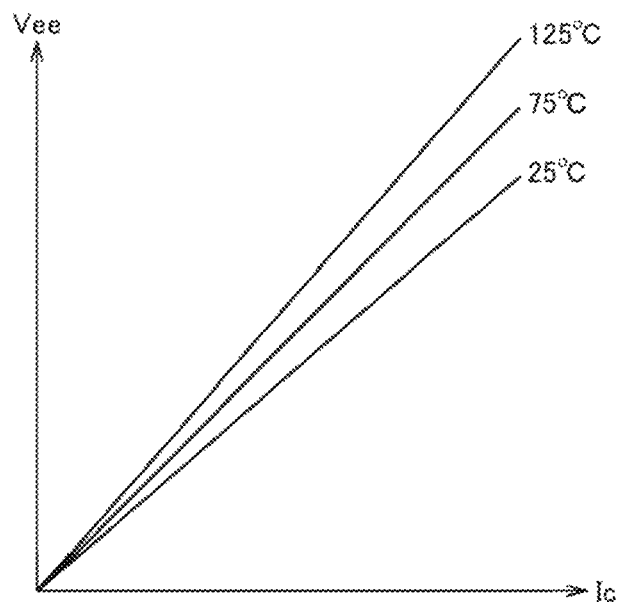
FIG. 16 is a diagram illustrating the relation between collector current $Ic$ and second voltage $Vee$ in an IGBT.

FIG. 16 is a diagram illustrating the relation between collector current Ic and second voltage Vee in an IGBT.

Second voltage Vee changes with collector current Ic and temperature Tk of power semiconductor element 1.

Even when power semiconductor element 1 is energized with the same collector current Ic, the resistance value of the metal layer on the surface of emitter electrode surface 12 of power semiconductor element 1 changes with temperature Tk. As a result, for example, second voltage Vee produced at 25° C. differs from the value of second voltage Vee produced at 125° C.

In the present embodiment, deteriorated section identifying unit 9 corrects temporal change ΔVee of second voltage Vee in accordance with temperature Tk of power semiconductor element 1.

Figure 17:
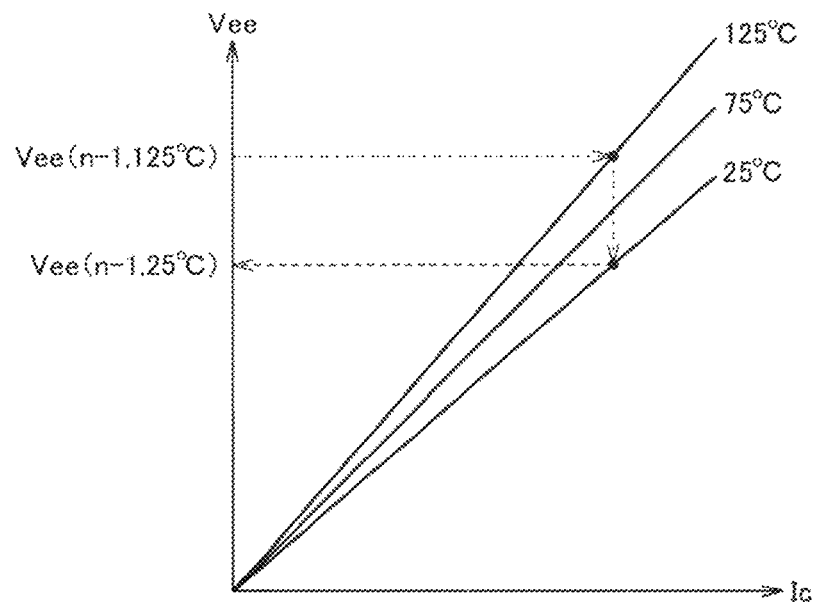
FIG. 17 is a diagram for explaining correction of second voltage $Vee$ at the point of time (n−1).

FIG. 17 is a diagram for explaining correction of second voltage Vee at the point of time (n−1).

When temperature Tk of power semiconductor element 1 is 125° C. and second voltage Vee is Vee (n−1, 125° C.) at the point of time (n−1), as shown in FIG. 17, deteriorated section identifying unit 9 determines second voltage Vee (n−1, 25° C.) when temperature Tk of power semiconductor element 1 is 25° C. under the condition that collector current Ic is the same.

Figure 18:
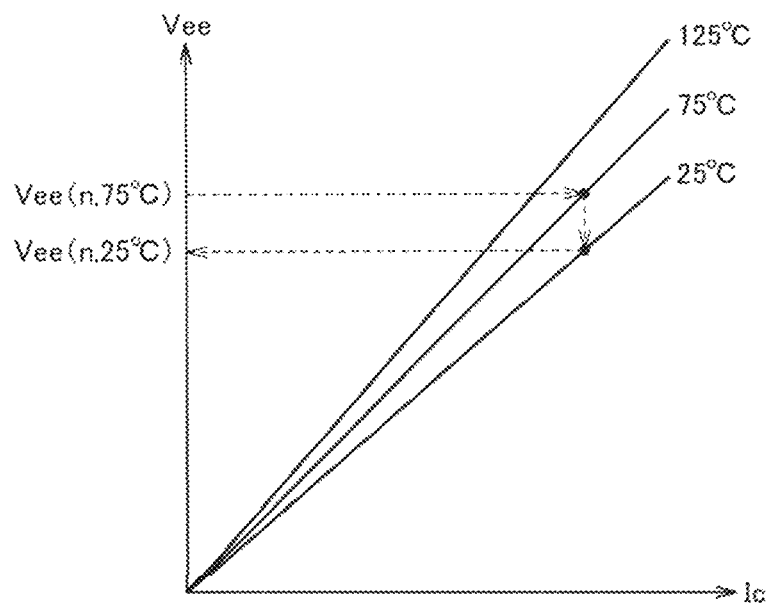
FIG. 18 is a diagram for explaining correction of second voltage $Vee$ at the point of time n.

FIG. 18 is a diagram for explaining correction of second voltage Vee at the point of time n.

When temperature Tk of power semiconductor element 1 is 75° C. and second voltage Vee is Vee (n, 75° C.) at the point of time n, as shown in FIG. 18, deteriorated section identifying unit 9 determines second voltage Vee (n, 25° C.)

when temperature Tk of power semiconductor element 1 is 25° C. under the condition that collector current Ic is the same.

Temporal change ΔVee of the second voltage with no correction with temperature Tk of power semiconductor element 1 is given as follows.

$$\Delta Vee = Vee(n, 75° C.) - Vee(n-1, 125° C.) \quad (5)$$

In comparison, deteriorated section identifying unit 9 according to the present embodiment determines temporal change ΔVee (25° C.) of the second voltage, using Vee (n, 25° C.) and Vee (n−1, 25° C.).

$$\Delta Vee(25° C.) = Vee(n, 25° C.) - Vee(n-1, 25° C.) \quad (6)$$

Deteriorated section identifying unit 9 uses the lookup table in FIG. 9 and identifies the deteriorated section corresponding to the combination of the corrected change ΔVce(25° C.) of the first voltage in Equation (4) and the corrected change ΔVee (25° C.) of the second voltage in Equation (6).

As described above, according to the present embodiment, even when temperature Tk of power semiconductor element 1 differs from the standard temperature presupposed by the lookup table, the deteriorated section can be identified using the lookup table for the standard temperature by correcting change ΔVce of the first voltage and change ΔVee of the second voltage based on temperature Tk of power semiconductor element 1.

Fifth Embodiment

In a fifth embodiment, change ΔVce of the first voltage and change ΔVee of the second voltage due to temperature Tk of power semiconductor element 1 are corrected in the same manner as in the fourth embodiment, but temperature Tk of power semiconductor element 1 is estimated without using temperature sensor 27.

Figure 19:
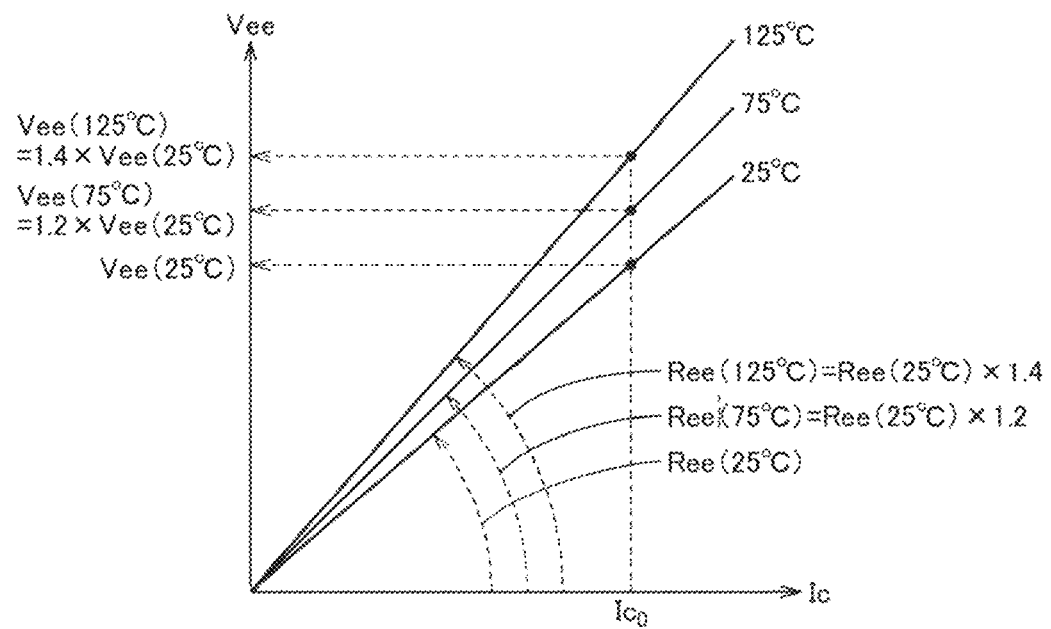
FIG. 19 is a diagram illustrating the relation between collector current Ic and second voltage Vee at three temperatures Tk in power semiconductor element 1.

FIG. 19 is a diagram illustrating the relation between collector current Ic and second voltage Vee at three temperatures in power semiconductor element 1.

As shown in FIG. 19, as long as deterioration does not occur in first bonding wires 15, second voltage Vee exhibits a certain change in accordance with temperature Tk of power semiconductor element 1 when collector current Ic is constant. This is attributed to that the elements of second voltage Vee are configured only with metal such as emitter electrode surface 12 and bonding wires 15.

When collector current Ic is constant, second voltage Vee changes at a predetermined rate in accordance with change in temperature Tk of power semiconductor element 1.

For example, it is assumed that the second voltage at 25° C. of power semiconductor element 1 is Vee (25° C.) when collector current Ic is Ic0. When collector current Ic is Ic0, second voltage Vee (75° C.) at 75° C. of power semiconductor element 1 is 1.2×Vee (25° C.) and second voltage Vee (125° C.) at 125° C. of power semiconductor element 1 is 1.4×Vee (25° C.).

When the collector current Ic is the same and when second voltage Vee at the standard temperature T0 of power semiconductor element 1 is standard voltage Vee0, second voltage Vee measured when the temperature of power semiconductor element 1 is Tk has the following relation.

$$Vee = K1(Tk-T0) \pm Vee0 \quad (7)$$

The resistance Ree (=Vee/Ic) (hereinafter second resistance) of a current path between emitter reference terminal 4 and emitter main terminal 3 that is represented by the value obtained by dividing second voltage Vee by collector current Ic does not depend on collector current Ic, and second resistance Ree changes at a predetermined rate in accordance with change in temperature Tk of power semiconductor element 1.

For example, the second resistance at 25° C. of power semiconductor element 1 is Ree (25° C.). Second resistance Ree (75° C.) at 75° C. of power semiconductor element 1 is 1.2×Ree (25° C.), and second voltage Vee (125° C.) at 125° C. of power semiconductor element 1 is 1.4×Ree (25° C.).

When second resistance Ree at standard temperature T0 of power semiconductor element 1 is standard resistance Ree0, second resistance Ree measured when the temperature of power semiconductor element 1 is Tk has the following relation.

$$Ree = K2(Tk-T0) + Ree0 \quad (8)$$

The precondition above does not hold when deterioration occurs in bonding section 20 of first bonding wire 15.

Typically, the influence of deterioration of bonding section 20 of first bonding wire 15 on second voltage Vee occurs instantaneously. Deterioration of bonding section 20 of first bonding wire 15 is caused by separation (lift-off) of the bonding portion. Even if partial separation of bonding section 20 gradually proceeds and the bonding area gradually diminishes, second voltage Vee hardly changes until complete separation. This is because bonding section 20 is extremely thin and the resistance value of bonding section 20 is originally extremely small.

To explain with a simple example, assuming that the cross-sectional area of bonding section 20 is the same as the cross-sectional area of first bonding wire 15, the thickness of bonding section 20 (the thickness of a crack running from the periphery) is 1 nm, and the crack running from the periphery of bonding section 20 decreases the cross-sectional area of bonding section 20 to ¹⁄₁₀₀₀. The increase in resistance is equivalent to increase in resistance when the length of first bonding wire 15 is 1000 times as large as 1 nm, that is, 1 μm. The increase in resistance when the area of bonding section 20 decreases to one millionth is equivalent to the increase in resistance when the length of first bonding wire 15 increases 1 mm. The separation of bonding section 20 proceeds completely and at the moment when first bonding wire 15 completely detaches from emitter electrode surface 12, the resistance of bonding section 20 instantaneously becomes infinite and second voltage Vee significantly fluctuates. That is, the change of second voltage Vee is instantaneous. Therefore, assuming that the temperature immediately before instantaneous increase of second voltage Vee is the same as the temperature immediately after the instantaneous increase, standard voltage Vee0 or standard resistance Reef can be corrected if fluctuations of second voltage Vee is always recorded.

Figure 20:
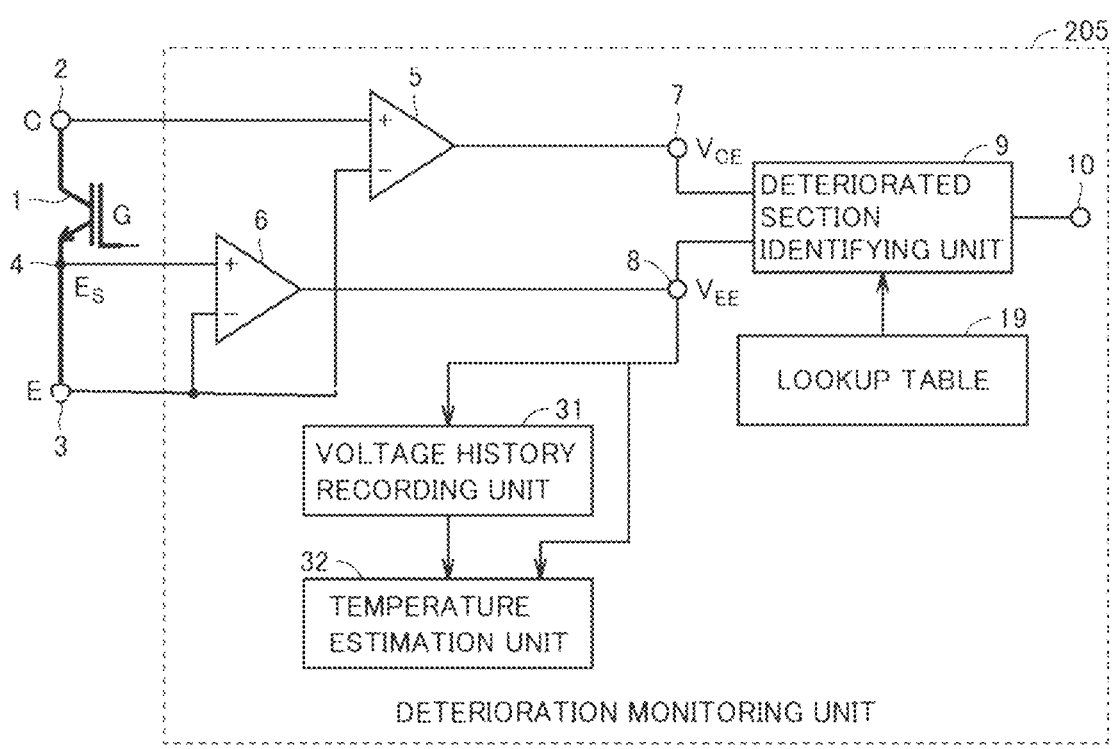
FIG. 20 is a diagram illustrating a configuration of a semiconductor device according to a fifth embodiment.

FIG. 20 is a diagram showing a configuration of a semiconductor device according to the fifth embodiment. The semiconductor device according to the fifth embodiment includes a voltage history recording unit 31 and a temperature estimation unit 32 in addition to the components of the semiconductor device according to the first embodiment.

Voltage history recording unit 31 stores the history of second voltage Vee.

When collector current Ic flowing through power semiconductor element 1 is constant, temperature estimation unit 32 estimates temperature Tk of the power semiconductor element, based on second voltage Vee, standard temperature T0, and standard voltage Vee0 that is second voltage Vee at standard temperature T0. When temporal change rate dVee of the second voltage is equal to or greater than a reference value TH1, temperature estimation unit 32 updates standard voltage Vee0 in accordance with temporal change rate dVee of the second voltage.

Figure 21:
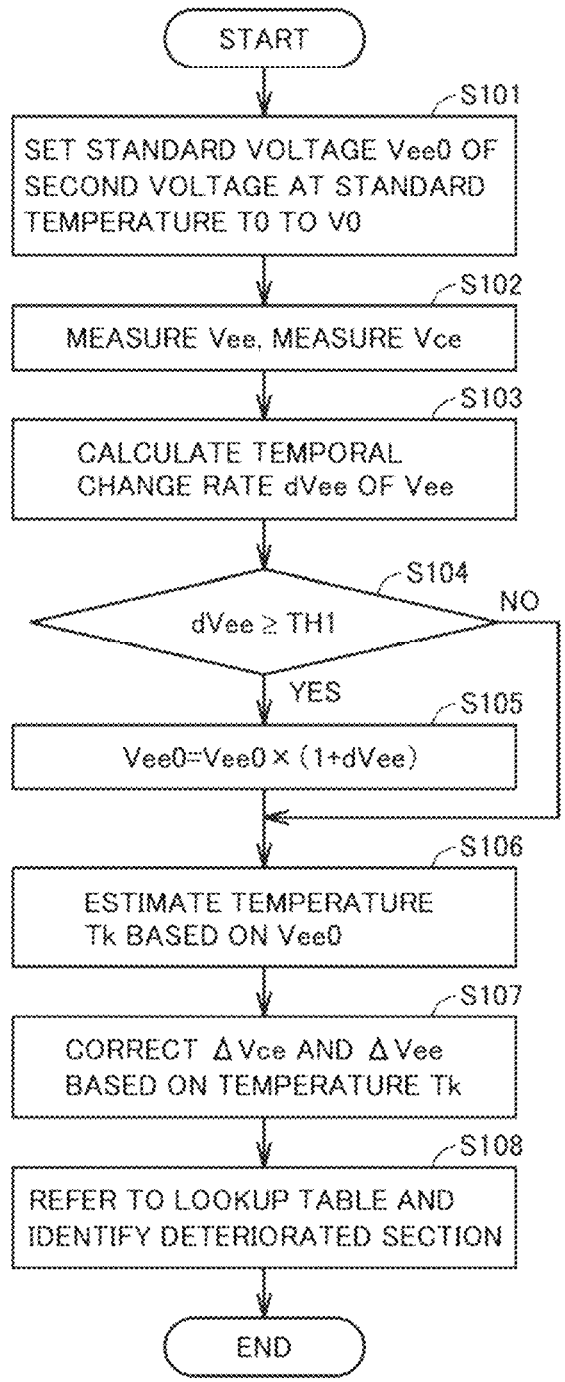
FIG. 21 is a flowchart illustrating a specific procedure of temperature estimation of power semiconductor element 1 and identification of a deteriorated section according to the fifth embodiment.

FIG. 21 is a flowchart illustrating a specific procedure of temperature estimation of power semiconductor element 1 and identification of a deteriorated section according to the fifth embodiment.

At step S101, temperature estimation unit 32 sets standard voltage Vee0 that is second voltage Vee for standard temperature T0 of power semiconductor element 1 to an initial value V0. Temperature estimating unit 32 sets collector current Ic to a certain value Ic0.

At step S102, temperature estimation unit 32 acquires first voltage Vce measured by first voltage measuring circuit 5 and second voltage Vee measured by second voltage measuring circuit 6.

At step S103, temperature estimation unit 32 calculates temporal change rate dVee of the second voltage. More specifically, when the latest second voltage is Vee(n) and the second voltage a point of time earlier recorded in voltage history recording unit 31 is Vee(n−1), temperature estimation unit 32 calculates temporal change rate dVee of second voltage Vee in accordance with the following equation.

$$dVee = \{Vee(n) - Vee(n-1)\} / Vee(n-1) \qquad (9)$$

At step S104, when temporal change rate dVee of the second voltage is equal to or greater than reference value TH1, the process proceeds to step S105, and when temporal change rate dVee of the second voltage is smaller than reference value TH1, the process proceeds to step S106.

At step S105, temperature estimation unit 32 updates standard voltage Vee0. More specifically, temperature estimation unit 32 sets a value obtained by multiplying standard voltage Vee0 at present by (1+dVee) as a new standard voltage Vee0.

At step S106, as indicated by the following equation, temperature estimation unit 32 estimates temperature Tk of power semiconductor element 1, based on standard temperature T0, standard voltage Vee0, and second voltage Vee.

$$Tk = (Vee - Vee0) / K1 + T0 \qquad (10)$$

At step S107, deteriorated section identifying unit 9 corrects change ΔVce of the first voltage and change ΔVee of the second voltage, based on temperature Tk of power semiconductor element 1, in the same manner as in the fourth embodiment.

At step S108, deteriorated section identifying unit 9 refers to the lookup table and identifies the deteriorated section, using the corrected change ΔVce of the first voltage and the corrected change ΔVee of the second voltage.

Figure 22:
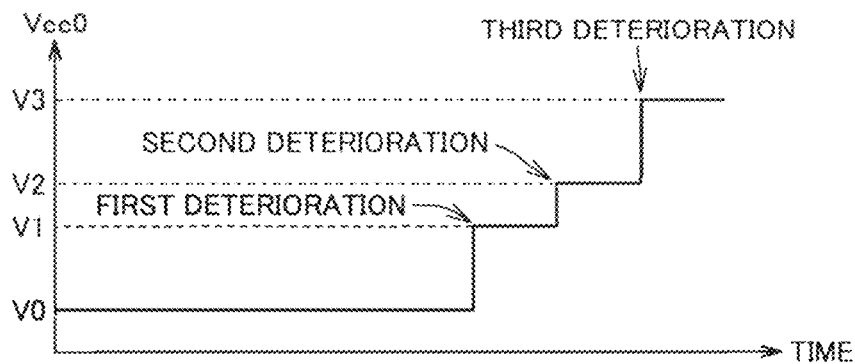
FIG. 22 is a diagram illustrating temporal change of standard voltage Vee0.

FIG. 22 is a diagram illustrating temporal change of standard voltage Vee0.

When none of the bonding sections of a plurality of first bonding wires 15 deteriorates, standard voltage Vee0 is set to initial value V0. When a first one of the bonding sections of bonding wires 15 deteriorates, step S105 is performed first time and standard voltage Vee0 is set to V1. When a second one of the bonding sections of bonding wires 15 deteriorates, step S105 is performed second time and standard voltage Vee0 is set to V2. When a third one of the bonding sections of bonding wires 15 deteriorates, step S105 is performed third time and standard voltage Vee0 is set to V3.

In this way, standard voltage Vee0 is updated in accordance with deterioration of first bonding wire 15, whereby the influence of temperature can be always corrected properly.

In order not to miss an instantaneous increase of second voltage Vee, second voltage Vee is sampled at short time intervals. Voltage history recording unit 31 may store second voltage Vee a point of time earlier.

As described above, the semiconductor device according to the fifth embodiment can estimate temperature Tk of power semiconductor element 1 based on the measured value of second voltage Vee, without installing a temperature sensor.

Sixth Embodiment

Figure 23:
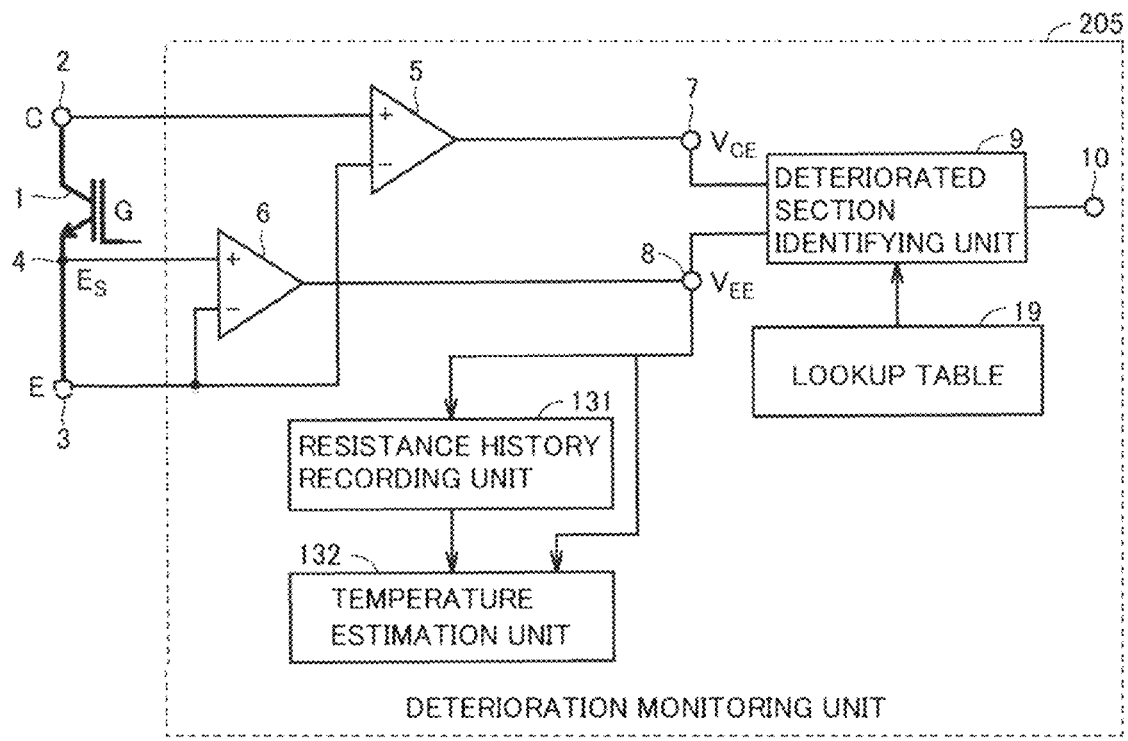
FIG. 23 is a diagram illustrating a configuration of a semiconductor device according to a sixth embodiment.

FIG. 23 is a diagram illustrating a configuration of a semiconductor device according to a sixth embodiment.

The semiconductor device according to the sixth embodiment includes a resistance history recording unit 131 and a temperature estimation unit 132 in addition to the components of the semiconductor device according to the first embodiment.

Resistance history recording unit 131 stores the history of second resistance Ree.

Temperature estimating unit 132 estimates temperature Tk of the power semiconductor element, based on second resistance Ree, standard temperature T0, and standard resistance Ree0 that is second resistance Ree at standard temperature T0. When temporal change rate dRee of the second resistance is equal to or greater than a reference value TH2, temperature estimation unit 132 updates standard resistance Ree0 in accordance with temporal change rate dRee of the second resistance.

Figure 24:
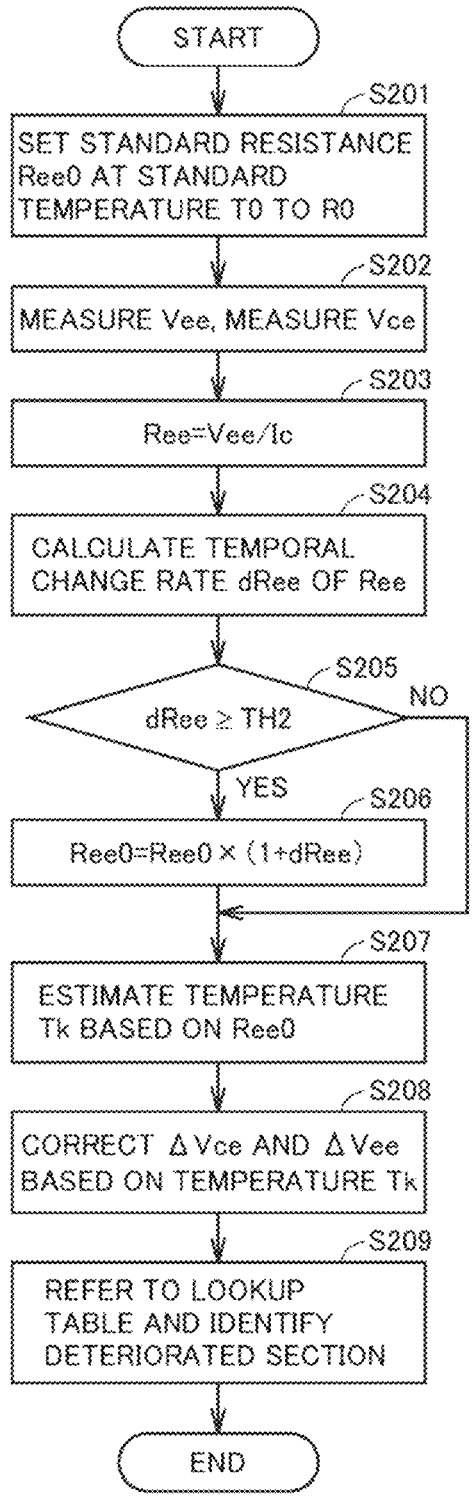
FIG. 24 is a flowchart illustrating a specific procedure of temperature estimation of power semiconductor element 1 and identification of a deteriorated section according to the sixth embodiment.

FIG. 24 is a flowchart illustrating a specific procedure of temperature estimation of power semiconductor element 1 and identification of a deteriorated section according to the sixth embodiment.

At step S201, temperature estimation unit 132 sets standard resistance Ree0 that is resistance Ree for standard temperature T0 of power semiconductor element 1 to an initial value R0.

At step S202, temperature estimation unit 132 acquires first voltage Vce measured by first voltage measuring circuit 5 and second voltage Vee measured by second voltage measuring circuit 6.

At step S203, temperature estimation unit 132 calculates second resistance Ree(Vee/Ic) by dividing second voltage Vee by collector current Ic.

At step S204, temperature estimation unit 132 calculates temporal change rate dRee of second resistance Ree. That is, when the latest second resistance is Ree(n) and the second resistance a point of time earlier is Ree(n−1), temperature estimation unit 132 calculates temporal change rate dRee of second resistance Ree in accordance with the following equation.

$$dRee = \{Ree(n) - Ree(n-1)\} / Ree(n-1) \qquad (11)$$

At step S205, when temporal change rate dRee of second resistance Ree is equal to or greater than reference value TH2, the process proceeds to step S206, and when temporal change rate dRee of second resistance Ree is smaller than reference value TH2, the process proceeds to step S207.

At step S206, temperature estimation unit 132 updates standard resistance Ree0. More specifically, temperature estimation unit 132 sets a value obtained by multiplying standard resistance Ree0 at present by (1+dRee) as a new standard resistance Ree0.

At step S207, temperature estimation unit 132 estimates temperature Tk of power semiconductor element 1, based on standard temperature T0, standard resistance Ree0, and second resistance Ree.

$$Tk=(Ree-Ree0)/K2+T0 \quad (12)$$

At step S208, deteriorated section identifying unit 9 corrects change ΔVce of the first voltage and change ΔVee of the second voltage, based on temperature Tk of power semiconductor element 1, in the same manner as in the fourth embodiment.

At step S209, deteriorated section identifying unit 9 refers to the lookup table and identifies the deteriorated section, using the corrected change ΔVce of the first voltage and the corrected change ΔVee of the second voltage.

As described above, the semiconductor device according to the sixth embodiment can estimate temperature Tk of power semiconductor element 1, based on the measured value of second voltage Vee and second resistance Ree obtained from collector current Ic, without installing a temperature sensor. The semiconductor device according to the fifth embodiment requires that collector current Ic should be constant in order to estimate temperature Tk of power semiconductor element 1. In comparison, the semiconductor device according to the sixth embodiment can estimate temperature Tk of power semiconductor element 1 even when collector current Ic is not constant.

Seventh Embodiment

In the present embodiment, the semiconductor device according to the foregoing first to sixth embodiments is applied to a power conversion device. Although the present embodiment is not limited to a specific power conversion device, a three-phase inverter to which the first to sixth embodiments are applied will be described below.

Figure 25:
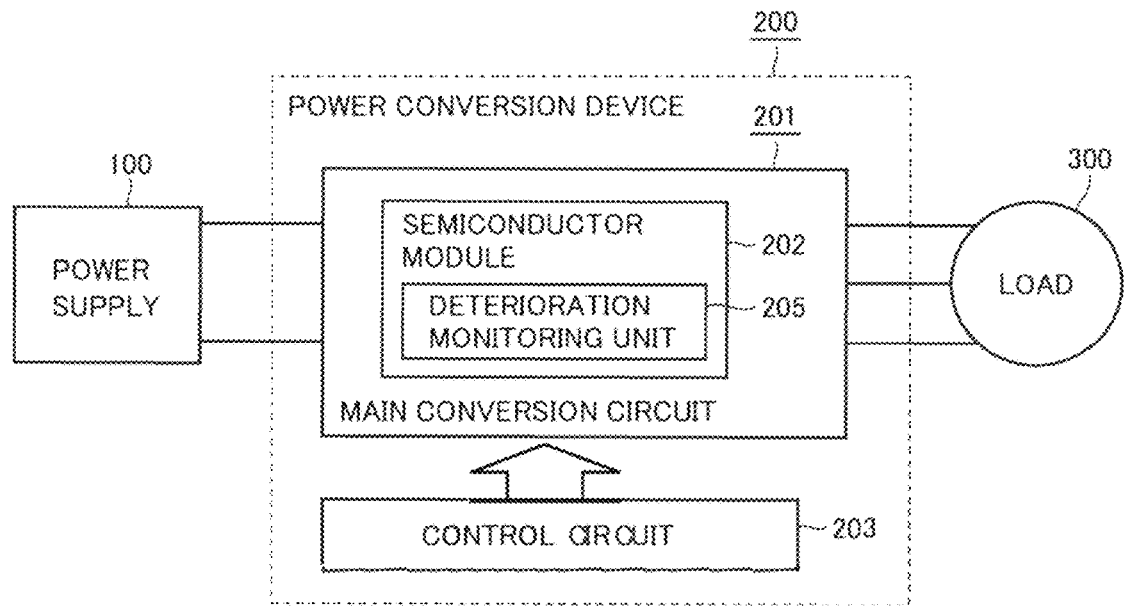
FIG. 25 is a block diagram showing a configuration of a power conversion system according to a seventh embodiment.

FIG. 25 is a block diagram showing a configuration of a power conversion system according to a seventh embodiment.

The power conversion system includes a power supply 100, a power conversion device 200, and a load 300.

Power supply 100 is a DC power supply and supplies DC power to power conversion device 200. Power supply 100 can be configured with a variety of power supplies. Power supply 100 can be configured with, for example, a DC system, a solar cell, or a storage battery. Power supply 100 may be configured with a rectifying circuit or an AC/DC converter connected to an AC system. Power supply 100 may be configured with a DC/DC converter that converts DC power output from a DC system to a predetermined power.

Power conversion device 200 is a three-phase inverter connected between power supply 100 and load 300. Power conversion, device 200 converts DC power supplied from power supply 100 into AC power and supplies the AC power to load 300. Power conversion device 200 includes a main conversion circuit 201 to convert DC power into AC power and output the AC power and a control circuit 203 to output a control signal for controlling main conversion circuit 201 to main conversion circuit 201.

Load 300 is a three-phase motor driven by AC power supplied from power conversion device 200. Load 300 is not limited to specific applications and is a motor installed in a variety of electric devices. Load 300 is a motor installed in, for example, a hybrid vehicle, an electric vehicle, a railway vehicle, an elevator, or an air conditioner.

The detail of power conversion device 200 will be described below.

Main conversion circuit 201 includes a semiconductor module 202. Semiconductor module 202 includes switching elements and freewsheel diodes (not shown). The switching elements are switched to convert DC power supplied from power supply 100 into AC power, which is in turn supplied to load 300. As shown in FIG. 25, deterioration monitoring unit 205 in the first to sixth embodiments may be arranged inside semiconductor module 202. Alternatively, deterioration monitoring unit 205 may be arranged outside semiconductor module 202.

There are a variety of specific circuit configurations of main conversion circuit 2031. Main conversion circuit 201 according to the present embodiment is a two-level three-phase full-bridge circuit. This circuit can be configured with six switching elements and six freewheel diodes connected in anti-parallel with the respective switching elements, Each switching element in main conversion circuit 201 corresponds to power semiconductor element 1 according to the foregoing first to sixth embodiments. Semiconductor module 202 corresponds to the power module according to the foregoing first to sixth embodiments. Every two switching elements of the six switching elements are connected in series to form upper and lower anus. The upper and lower arms constitute each phase (U phase, V phase, W phase) of the full-bridge circuit. The output terminals of the upper and lower arms, that is, three output terminals of main conversion circuit 201 are connected to load 300.

Main conversion circuit 201 includes a drive circuit (not shown) for driving each switching element. However, the drive circuit may be contained in semiconductor module 202 or the drive circuit may be provided separately from semiconductor module 202. The drive circuit generates a drive signal for driving a switching element of main conversion circuit 201 and supplies the drive signal to the control electrode of the switching element of main conversion circuit 201. Specifically, the drive circuit outputs a drive signal for turning on a switching element and a drive signal for turning off a switching element to the control electrode of each switching element, in accordance with a control signal from control circuit 203. When the switching element is to be kept on, the drive signal is a voltage signal (ON signal) equal to or higher than a threshold voltage of the switching element. When the switching element is to be kept off, the drive signal is a voltage signal (OFF signal) equal to or lower than the threshold voltage of the switching element.

Control circuit 203 controls the switching elements of main conversion circuit 201 such that a desired power is supplied to load 300. Specifically, the time (ON time) during which each switching element of main conversion circuit 201 is to be in the ON state is calculated based on power to be supplied to load 300. For example, control circuit 203 can control main conversion circuit 201 by pulse width modulation (PWM) control that modulates the ON time of the switching elements in accordance with a voltage to be output. Control circuit 203 outputs a control command (control signal) to a drive circuit in main conversion circuit 201 such that an ON signal is output to a switching element to be turned on and an OFF signal is output to a switching element to be turned off, at each point of time. The drive circuit outputs an ON signal or an OFF signal as a drive signal to the control electrode of each switching element in accordance with this control signal.

The power module of the power conversion device according to the present embodiment includes deterioration monitoring unit 205 in the first to sixth embodiments. This configuration can detect which one of the bonding sections of a plurality of first bonding wires 15 to power semiconductor element 1 deteriorates and estimate the lifetime of power semiconductor element 1 and semiconductor module 202. Deterioration monitoring unit 205 outputs information on deterioration or lifetime to control circuit 203 and modifies a drive signal output from the drive device, if necessary.

In the present embodiment, an example in which the first to sixth embodiments are applied to a two-level three-phase inverter has been described. However, the first to sixth embodiments can be applied to a variety of power conversion devices. Although the present embodiment is a two-level power conversion device, it may be a three-level or multi-level power conversion device. The first to sixth embodiments can be applied to a single-phase inverter when power is supplied to a single-phase load. When power is supplied to a DC load or the like, the first to sixth embodiments may be applied to a DC/DC converter or an AC/DC converter.

Load 300 connected to power conversion device 200 is not limited to a motor. Power conversion device 200 can be used as, for example, a power supply device for an electric spark machine, a laser beam machine, an induction heating cooker, or a wireless charging system. Power conversion device 200 can be used as a power conditioner for a photovoltaic system or a power storage system.

Figure 26:
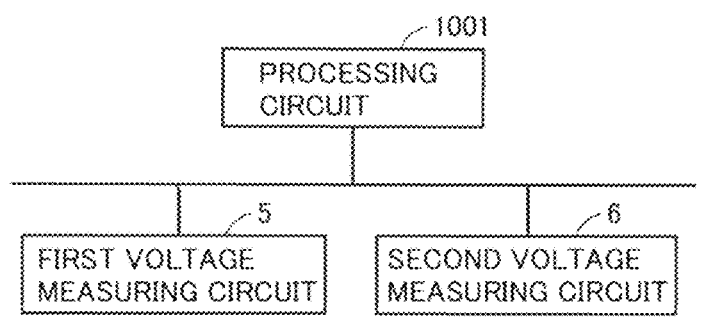
FIG. 26 is a diagram illustrating a specific configuration of a deterioration monitoring unit 205 according to the first to sixth embodiments.

FIG. 26 is a diagram illustrating a specific configuration of deterioration monitoring unit 205 according to the first to sixth embodiments.

For example, the functions of deteriorated section identifying unit 9 and lookup table storage unit 19 in FIG. 1 are implemented by a processing circuit 1001.

Processing circuit 1001 can be implemented by dedicated hardware. The processing circuit corresponds to a single circuit, a composite circuit, a programmed processor, a parallel programmed processor, an application specific integrated circuit (ASIC), a field programmable gate array (FPGA), or a combination thereof.

Figure 27:
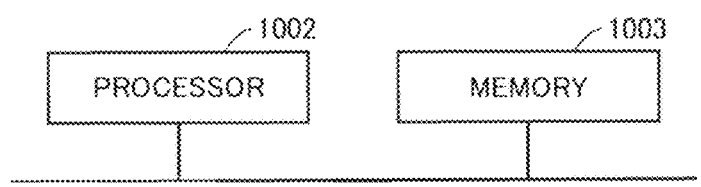
FIG. 27 is a diagram illustrating an example in which a processing circuit 1001 is implemented by software.

FIG. 27 is a diagram illustrating an example in which processing circuit 1001 is implemented by software.

As shown in FIG. 27, processing circuit 1001 may implement the function of each unit by a processor 1002 reading and executing a program stored in a memory 1003. Processor 1002 corresponds to a central processing unit (CPU), a processing device, a computing device, a microprocessor, a microcomputer, or a digital signal processor (DSP).

The functions of deteriorated section identifying unit 9 and lookup table storage unit 19 are implemented by software, firmware, or a combination of software and firmware. Software or firmware is described as a program and stored in memory 1003. Memory 1003 corresponds to, for example, a volatile or nonvolatile semiconductor memory such as a random access memory (RAM), a read only memory (ROM), a flash memory, an erasable programmable read only memory (EPROM), or an electrically erasable programmable read only memory (EEPROM), a magnetic disc, a flexible disc, an optical disc, a compact disc, a mini disc, or a digital versatile disc (DVD).

Some of the functions of deteriorated section identifying unit 9 and lookup table storage unit 19 may be implemented by dedicated hardware and some of them may be implemented by software or firmware.

In this way, processing circuit 1001 can implement the functions described above by hardware, software, firmware, or a combination thereof.

(Modifications)

(1) In the foregoing embodiments, an IGBT is used as power semiconductor element 1. However, the kind of power semiconductor element is not limited to IGBT and, for example, a metal-oxide-semiconductor field-effect transistor (MOSFET) may be used. In this case, "collector" should read as "drain" and "emitter" should read as "source" so that the embodiments can be applied similarly. Similarly, "Vce" should read as "Vds" and "Vee" should read as "Vss".

(2) FIG. 28 is a diagram illustrating another example of the correspondence relation between the first deteriorated section and a combination of temporal change ΔVce of first voltage Vee and temporal change ΔVce of second voltage Vee.

When the first deteriorated section is bonding section 20A, first voltage Vce increases 20% or more and second voltage Vee increases 10% or more. When the first deteriorated section is bonding section 20B, first voltage Vce increases 20% or more and second voltage Vee increases 40% or More. When the first deteriorated section is bonding section 20C, first voltage Vce increases 30% or more and second voltage Vee increases 10% or more. When the first deteriorated section is bonding section 20D, first voltage Vce increases 30% or more and second voltage Vee increases 40% or more.

FIG. 29 is a diagram illustrating another example of the lookup table for identifying the first deteriorated section. This lookup table can be derived from the correspondence relation in FIG. 28.

It is defined that the first deteriorated section is bonding section 20A when first voltage Vce increases 20% or more and less than 30% and second voltage Vee increases 10% or more and less than 40%. It is defined that the first deteriorated section is bonding sections 20A and 20C when first voltage Vee increases 30% or more and second voltage Vee increases 10% or more and less than 40%. It is defined that the first deteriorated section is bonding sections 20A and 20B when first voltage Vee increases 20% or more and less than 30% and second voltage Vee increases 40% or more. It is defined that the first deteriorated section is bonding sections 20A, 20B, 20C, and 20D when first voltage Vce increases 30% or more and second voltage Vee increases 40% or more.

Deteriorated section identifying unit 9 refers to the lookup table in FIG. 29 and identifies the deteriorated section corresponding to the combination of temporal change ΔVce of first voltage Vce and temporal change ΔVce of second voltage Vee. When the combination of temporal change ΔVce of first voltage Vce and temporal change ΔVce of second voltage Vee is not included in the lookup table, deteriorated section identifying unit 9 determines that a plurality of bonding sections to emitter electrode surface 12 to which a plurality of first bonding wires 15 are connected do not have a deteriorated section.

Embodiments disclosed here should be understood as being illustrative rather than being limitative in all respects. The scope of the present invention is shown not in the foregoing description but in the claims, and it is intended that all modifications that conic within the meaning and range of equivalence to the claims are embraced here.

REFERENCE SIGNS LIST 1 power semiconductor element, 2 collector main terminal, 3 emitter main terminal, 4 emitter reference terminal, 5 first voltage measuring circuit, 6 second voltage measuring circuit, 7 first output terminal, 8 second output terminal, 9 deteriorated section identifying unit, 10 third output terminal, 11 collector substrate, 12 emitter electrode surface, 13 solder. 14 third bonding wire, 15, 15A to 15D first bonding wire, 16 second bonding wire, 17 flow of main current, 18 heating, 19 lookup table storage unit, 20A to 20D bonding section, 21 gate terminal, 22 gate bonding wire, 23 deteriorated section history recording unit, 25 lifetime estimation unit, 27 temperature sensor, 31 voltage history recording unit, 32, 132 temperature estimation unit, 100 power supply, 119 deteriorated section, 131 resistance history recording unit, 200 power conversion device, 201 main conversion circuit, 202 semiconductor module, 203 control circuit, 205 deterioration monitoring unit, 300 load, 1001 processing circuit, 1002 processor, 1003 memory.

The invention claimed is:

1. A semiconductor device comprising:
   a power semiconductor element;
   a collector substrate electrically connected to the power semiconductor element;
   a collector main terminal electrically connected to the collector substrate;
   an emitter main terminal connected to an emitter electrode surface of the power semiconductor element by a plurality of first bonding wires;
   an emitter reference terminal connected to the emitter electrode surface of the power semiconductor element by a second bonding wire;
   a first voltage measuring circuit to measure a first voltage that is a difference between a potential at the collector main terminal and a potential at the emitter main terminal;
   a second voltage measuring circuit to measure a second voltage that is a difference between a potential at the emitter reference terminal and a potential at the emitter main terminal; and
   a deteriorated section identifier to refer to correspondence information that defines a deteriorated section of a plurality of bonding sections to the emitter electrode surface to which the first bonding wires are connected, for a combination of temporal change of the first voltage and temporal change of the second voltage, and to identify the deteriorated section corresponding to a combination of temporal change of the first voltage measured by the first voltage measuring circuit and temporal change of the second voltage measured by the second voltage measuring circuit.

2. The semiconductor device according to claim 1, further comprising a recorder to record history of the identified deteriorated section.

3. The semiconductor device according to claim 2, wherein
   when none of the bonding sections deteriorate, the deteriorated section identifier refers to first correspondence information for no deterioration as the correspondence information and identifies the deteriorated section, and
   when any of the bonding sections deteriorates, the deteriorated section identifier refers to second correspondence information corresponding to the deteriorated section as the correspondence information and identifies the deteriorated section.

4. The semiconductor device according to claim 2, further comprising a lifetime estimator to estimate lifetime of the semiconductor device, based on history of the deteriorated section and a driving method of the power semiconductor element.

5. The semiconductor device according to claim 4, wherein the lifetime estimator switches a driving method of the power semiconductor element, based on the estimated lifetime.

6. The semiconductor device according to claim 4, wherein the lifetime estimator gives a notice to a user to recommend switching of a driving method of the power semiconductor element, based on the estimated lifetime.

7. The semiconductor device according to claim 1, further comprising a temperature sensor to measure temperature of the power semiconductor element.

8. The semiconductor device according to claim 1, further comprising a temperature estimator to estimate temperature of the power semiconductor element, based on the second voltage, a standard temperature, and a standard voltage that is the second voltage at the standard temperature, when collector current flowing through the power semiconductor element is constant.

9. The semiconductor device according to claim 8, wherein when a rate of temporal change of the second voltage is equal to or greater than a reference value, the temperature estimator updates the standard voltage in accordance with the rate of temporal change of the second voltage.

10. The semiconductor device according to claim 9, wherein when the rate of temporal change of the second voltage is ΔVee, the temperature estimator sets a value obtained by multiplying the standard voltage at present by (1+ΔVee) as a new standard voltage.

11. The semiconductor device according to claim 1, further comprising a temperature estimator to estimate temperature of the power semiconductor element, based on a second resistance obtained by dividing the second voltage by collector current flowing through the power semiconductor element, a standard temperature, and a standard resistance that is the second resistance at the standard temperature.

12. The semiconductor device according to claim 11, wherein when a rate of temporal change of the second resistance is equal to or greater than a reference value, the temperature estimator updates the standard resistance in accordance with the rate of temporal change of the second resistance.

13. The semiconductor device according to claim 12, wherein when the rate of temporal change of the second resistance is ΔRee, the temperature estimator sets a value obtained by multiplying the standard resistance at present by (1+ΔRee) as a new standard resistance.

14. The semiconductor device according to claim 7, wherein
   the correspondence information defines a deteriorated section of the bonding sections, for a combination of temporal change of the first voltage and temporal change of the second voltage at a standard temperature, and
   the deteriorated section identifier corrects temporal change of the measured first voltage and temporal change of the measured second voltage in accordance with temperature of the power semiconductor element and refers to the correspondence information to identify the deteriorated section corresponding to a combination of the corrected temporal change of the first voltage and the corrected temporal change of the second voltage.

15. A power conversion device comprising:
   the semiconductor device according to claim 1;
   a main conversion circuit to convert input power and output the converted power; and a control circuit to output a control signal for controlling the main conversion circuit to the main conversion circuit.

* * * * *